(12) United States Patent
Aoki et al.

(10) Patent No.: US 6,191,441 B1
(45) Date of Patent: Feb. 20, 2001

(54) FERROELECTRIC MEMORY DEVICE AND ITS DRIVE METHOD

(75) Inventors: Masaki Aoki; Hirotaka Tamura; Hideki Takauchi; Takashi Eshita, all of Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/178,426

(22) Filed: Oct. 26, 1998

(30) Foreign Application Priority Data

Oct. 28, 1997 (JP) ..................................................... 9-295878
Oct. 28, 1997 (JP) ..................................................... 9-295879

(51) Int. Cl.[7] ................................................. H01L 29/76
(52) U.S. Cl. ...................... 257/295; 257/296; 257/310; 257/532; 365/145
(58) Field of Search ............................... 257/295, 296, 257/310, 532; 365/145

(56) References Cited

U.S. PATENT DOCUMENTS

| | | | |
|---|---|---|---|
| 5,155,573 | * 10/1992 | Abe et al. | 257/532 |
| 5,721,700 | * 2/1998 | Katoh | 257/295 |
| 5,798,775 | 8/1998 | Takahashi et al. | 347/33 |
| 5,856,688 | * 1/1999 | Lee et al. | 257/295 |
| 5,907,762 | * 5/1999 | Evans et al. | 438/3 |

FOREIGN PATENT DOCUMENTS 6-104447   4/1994   (JP) .
6-119773   4/1994   (JP) .

OTHER PUBLICATIONS

Patent Abstracts of Japan; vol. 1996, No. 03, 29 mars 1996 (Mar. 29, 1996) & jp 07 297302 a (oki electric ind co ltd) 10 novembre 1995 (Nov. 11, 1995) *abrege*.
Patent Abstracts of Japan; vol. 017, No. 504 (E–1430), 10 septembre 1993 (Sep. 10, 1993) & JP 05 129625 A (Rohm Co Ltd), 25 mai 1993 (May 25, 1993) *abrege*.
Patent Abstracts of Japan; vol. 1995, No. 07, 31 aout 1995 (Aug. 31, 1995) & JP 07 106528 A (Nippondenso Co Ltd), 21 avril 1995 (Apr. 21, 1995) *abrege*.
Patent Abstracts of Japan; vo. 1997, No. 05, 30 mai 1997 (May 30, 1997) & JP 09 027191 A (Rohm Co Ltd), 28 Janiver 1997 (Jan. 28, 1997) *abrege*.

* cited by examiner

*Primary Examiner*—J. Carroll
(74) *Attorney, Agent, or Firm*—Armstrong, Westerman, Hattori, McLeland & Naughton

(57) ABSTRACT

A ferroelectric memory capable of writing data at a small operation voltage has an insulated-gate field effect transistor, a ferroelectric film, and a pair of capacitor electrodes formed on the ferroelectric film and facing each other, one of the pair of capacitor electrodes being electrically connected to the insulated gate. A ferroelectric memory device with a simple structure has an insulated-gate field effect transistor including a source, a drain, and an insulated gate, and a ferroelectric capacitor connected between the drain and the insulated gate.

20 Claims, 18 Drawing Sheets

WRITE

READ

READ CURRENT

○ : +Vcc
● : −Vcc
□ : +Vcc/3
■ : −Vcc/3

FERROELECTRIC MEMORY DEVICE AND ITS DRIVE METHOD

This application is based on Japanese Patent Applications No. 9-295878 and No. 9-295879 both filed on Oct. 28, 1997, and No. 10-297114 filed on Oct. 19, 1998, the entire contents of which are incorporated herein by reference.

BACKGROUND OF THE INVENTION

1.) Field of the Invention

The present invention relates to a ferroelectric memory device, and more particularly a ferroelectric memory device suitable for a 1T-1C type memory which forms one memory cell by using one transistor and one ferroelectric capacitor, and to a method of driving a 1T-1C type memory.

2.) Description of the Related Art

A ferroelectric capacitor made of ferroelectric material interposed between a pair of electrodes produces polarization in an amount corresponding an applied voltage. The characteristics of a polarization amount relative to an applied voltage show hysteresis, and even if the applied voltage is turned off, there remains residual polarization. If residual polarization is formed corresponding in amount to input data, a non-volatile memory can be formed by using the ferroelectric capacitor. For example, an insulated-gate field effect transistor can be turned on or off in accordance with polarization of a ferroelectric capacitor whose one electrode is connected to the insulated gate of the transistor.

Products of a 2T-2C type ferroelectric random access memory (FeRAM) using two transistors and two capacitors per one memory cell are now available up to 64 k bits. However, a 1T-1C type FeRAM using one transistor and one capacitor per one memory cell is still under the development stage for practical application.

FIGS. 8A to 8C show a ferroelectric capacitor according to conventional techniques. As shown in FIG. 8A, on the surface of a p-type silicon substrate 51, a floating gate electrode 53 of polysilicon or the like is formed, with a gate oxide film 52 being interposed between the substrate and the floating gate electrode. On this floating gate electrode 53, a ferroelectric layer 54 is formed, and on this ferroelectric layer 54, a control gate electrode 55 is formed. This lamination structure is patterned to form a gate electrode. A source region 61 and a drain region 62 are formed on both sides of the gate electrode by doping n-type impurities through ion implantation.

Consider that a positive voltage +V is applied to the control gate electrode 55 and thereafter this voltage is turned off. Upon application of a voltage of +V, the ferroelectric layer 54 induces polarization as shown in FIG. 8A. This polarization remains and becomes residual polarization even after the applied voltage to the control gate electrode 55 is turned off. The residual polarization charges the floating gate electrode 53 positive and induces an n-channel 60 in the surface layer of the p-type silicon substrate 51. The source region 61 and the drain region 62 are therefore electrically connected via the n-channel 60.

As shown in FIG. 8B, consider that a negative voltage −V is applied to the control gate electrode 55 and thereafter this voltage is turned off. Upon application of a voltage of −V, the ferroelectric layer 54 induces polarization of a polarity opposite to that shown in FIG. 8A. This polarization remains and becomes residual polarization even after the applied voltage to the control gate electrode 55 is turned off. The residual polarization charges the floating gate electrode 53 negative and extinguishes the channel in a surface layer of the p-type silicon substrate 51. The source 61 and the drain 62 are therefore electrically cut off.

In the above manner, data can be stored in a non-volatile way by making the applied voltage to the control gate electrode 55 relative to the substrate 51 control the polarization of the ferroelectric layer 54.

The ferroelectric memory shown in FIG. 8C has a series circuit of a capacitor C2 and a capacitor C1, the former utilizing the gate oxide film 52 as the capacitor dielectric layer and the latter utilizing the ferroelectric layer 54 as the capacitor dielectric layer. Since the dielectric constant of the ferroelectric layer 54 is considerably higher than that of the gate oxide film 52, the capacitance of the capacitor C1 tends to be larger than that of the capacitor C2.

As shown in FIG. 8C, as a voltage V is applied across the substrate 51 and the control gate electrode 55, a voltage V1 across the ferroelectric capacitor C1 become less than a voltage V2 across the series connected capacitor C2.

If the hysteresis characteristics of the ferroelectric capacitor require the voltage V1, a large voltage of V1+V2 is required to be applied to the control gate electrode 55.

SUMMARY OF THE INVENTION

It is an object of the present invention to provide a ferroelectric memory capable of writing data with a small voltage.

It is another object of the present invention to provide a ferroelectric memory having a novel structure.

It is a further object of the present invention to provide a 1T-1C type ferroelectric memory device having a simple structure.

It is a still further object of the present invention to provide a ferroelectric memory device capable of performing write operation by using only two lines, e.g. word and bit lines.

It is another object of the present invention to provide a novel drive method for a 1T-1C type ferroelectric memory device.

According to one aspect of the present invention, there is provided a ferroelectric memory device comprising: a semiconductor substrate; an insulated-gate field effect transistor including a gate insulating film formed on a surface of the semiconductor substrate, a gate electrode formed on the gate insulating film, and source and drain regions formed in a surface layer of the semiconductor substrate on both sides of the gate electrode; an insulating film formed over the surface of the semiconductor substrate and covering the gate electrode; a ferroelectric film formed on the insulating film; and a pair of capacitor electrodes formed on the ferroelectric film and facing each other, one of the pair of capacitor electrodes being electrically connected to the gate electrode.

Since a ferroelectric capacitor is formed by forming a pair of opposing electrodes on one surface of a ferroelectric layer, the ferroelectric capacitor having a desired capacitance can be formed. By disposing one of the opposing capacitor electrodes above the gate electrode, a stray capacitor of the capacitor electrode can be reduced.

According to another aspect of the present invention, there is provided a ferroelectric memory device comprising: an insulated-gate field effect transistor having a source, a drain, and an insulated gate; and a memory cell including a ferroelectric capacitor connected to the drain and the insulated gate.

By connecting a ferroelectric capacitor between the insulated-gate and the drain of an insulated-gate field effect transistor, a diode-connection field effect transistor can be formed. The rise potential (threshold value) of the diode-connection field effect transistor can be controlled by residual polarization of the ferroelectric capacitor.

Polarization in the ferroelectric capacitor can be controlled by a voltage applied across the drain and the source.

According to another aspect of the present invention, there is provided a method of driving a ferroelectric memory device which comprises: a plurality of bit lines disposed in parallel; a plurality of word lines disposed in parallel, the word lines crossing the bit lines; and a ferroelectric memory cell connected at each cross point between the bit and word lines, the ferroelectric memory cell including an insulated-gate field effect transistor having a source, a drain, and an insulated gate, and a ferroelectric capacitor connected across the drain and the insulated-gate, the method comprising the steps of: (a) connecting a selected word line to a ground potential and applying a first reference potential to other word lines and all the bit lines, to write data "1" in all the ferroelectric memory cells connected to the selected word line; (b) supplying in succession the ground potential and the first reference potential to ferroelectric memory cells to be written with data "1" among the ferroelectric memory cells connected to the selected word line, and supplying a second reference potential smaller than the first reference potential to other bit lines and a third reference potential larger than the second reference potential to other word lines, to write data "1" in the ferroelectric memory cells to be written with data "1"; and (c) setting potentials of the bit lines and potentials of the word lines other than the selected word line to same potentials as the step (b), and supplying a fourth reference potential larger than the first reference potential to the selected word line, to write data "0" in ferroelectric memory cells not written with data "1" at the step (b) among the ferroelectric memory cells connected to the selected word line.

After data "1" is once written in a plurality of memory cells connected to a selective word line, data "1" is again written in the memory cells to be written with the data "1" and data "0" is written in the memory cells to be written with the data "0". Accordingly, the data write scheme having a high write disturb resistance can be provided.

According to another aspect of the present invention, there is provided a ferroelectric memory device comprising: a semiconductor substrate; an insulated-gate electrode formed on the semiconductor substrate; a source region and a drain region formed in a surface layer of the semiconductor substrate on both sides of the insulated-gate; a first insulating layer formed over a surface of the semiconductor substrate, surrounding the insulated-gate electrode, and forming a common upper surface with the gate electrode; an opening groove reaching the drain through the first insulating layer; a bit wiring burying the opening groove and forming an upper surface common to the first insulating film; and a ferroelectric layer formed on the common upper surface and covering the insulated-gate electrode and the bit wiring.

The insulated-gate electrode, first insulating layer, and bit wiring are formed to have the common flat surface, and on this common flat surface, the ferroelectric layer is formed. Accordingly, it is possible to provide a ferroelectric memory cell which is easy to make the structure compact and has stable characteristics.

As above, a ferroelectric memory can be provided which has a desired small capacitance. When the capacitance of the ferroelectric capacitor is made smaller than that of the insulated-gate electrode, most of the applied voltage can be applied to the ferroelectric capacitor.

Since the opposing electrodes of a ferroelectric capacitor are formed on one surface of the ferroelectric layer, the characteristics of the ferroelectric capacitor can be easily made stable, and the patterning process of the opposing electrodes can be made simple.

A ferroelectric memory device of simple structure can also be provided.

Using only one transistor per one memory cell, a drive method for a ferroelectric memory device with a high write disturb resistance can be provided.

DETAILED DESCRIPTION OF THE PREFERRED EMBODIMENTS

Figure 8A:
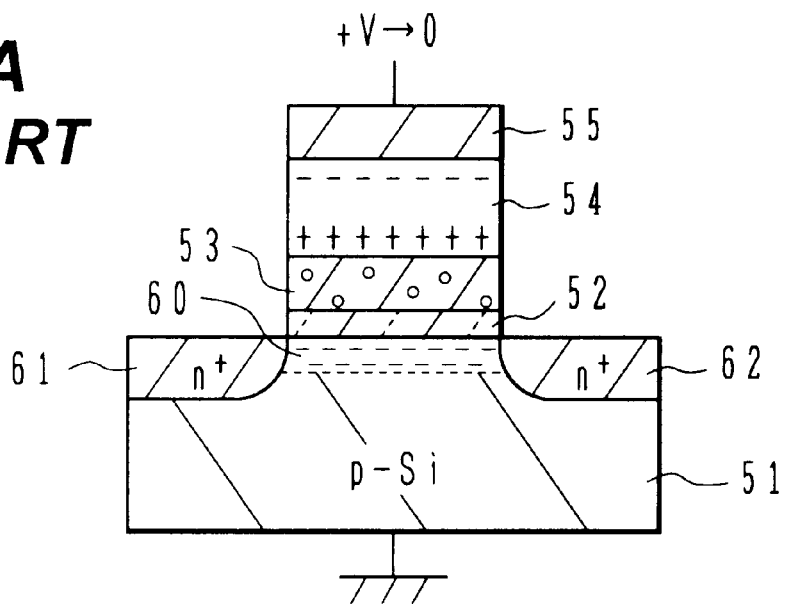
FIGS. 8A to 8C are cross sectional views and an equivalent circuit illustrating a conventional ferroelectric memory.
Figure 8B:
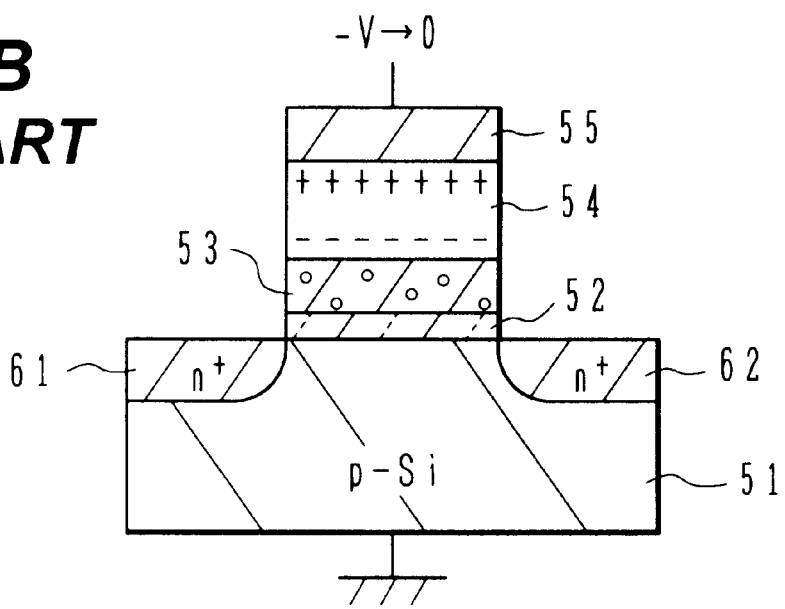
Figure 8C:
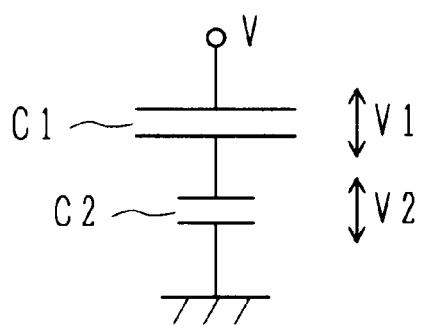

In the ferroelectric memory shown in FIGS. 8A and 8B, the lamination structure of the gate oxide film, floating gate electrode, ferroelectric layer, and control gate electrode is patterned in the same shape, and the capacitance of the ferroelectric capacitor tends to be larger than that of the capacitor formed by the substrate and floating gate electrode. If the capacitance of the ferroelectric capacitor is made small, the ferroelectric layer becomes abnormally thick and manufacture processes become difficult.

The structure that the ferroelectric layer is sandwiched between the floating gate electrode and control gate electrode is likely to form a difference between an interface quality between the floating gate electrode and the ferroelectric layer and an interface quality between the ferroelectric layer and the control gate electrode. It is, therefore, not easy to obtain a stable performance of the ferroelectric capacitor.

The present inventors propose to form a ferroelectric capacitor having a pair of electrodes being disposed in parallel on one surface of a ferroelectric layer. It is possible almost freely to set the capacitance of a ferroelectric capacitor by adjusting the thickness of a ferroelectric layer and the distance between electrodes.

FIGS. 4A and 4B and FIGS. 5A and 5B are diagrams and graphs explaining the preliminary experiments made by the present inventors.

Figure 4A:
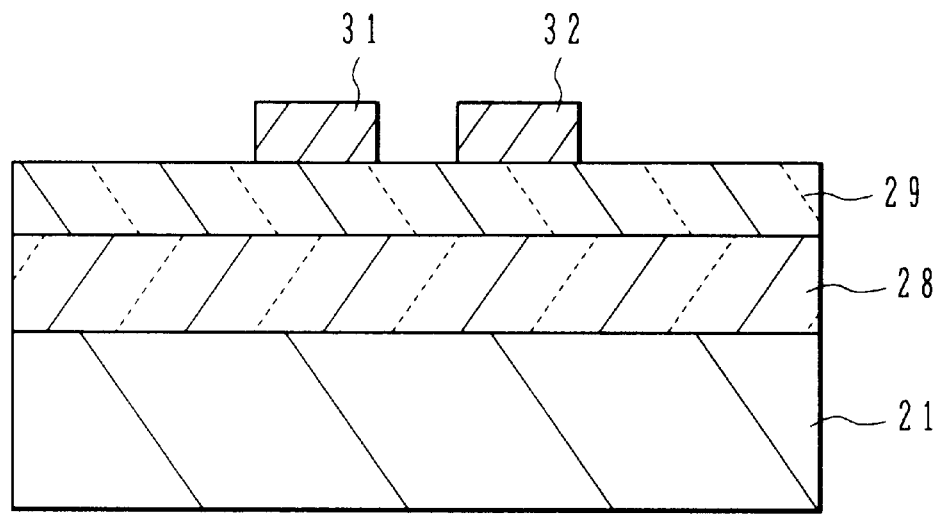
FIGS. 4A and 4B are a cross sectional view and a plan view for illustrating preliminary experiments made by the present inventors.
Figure 4B:
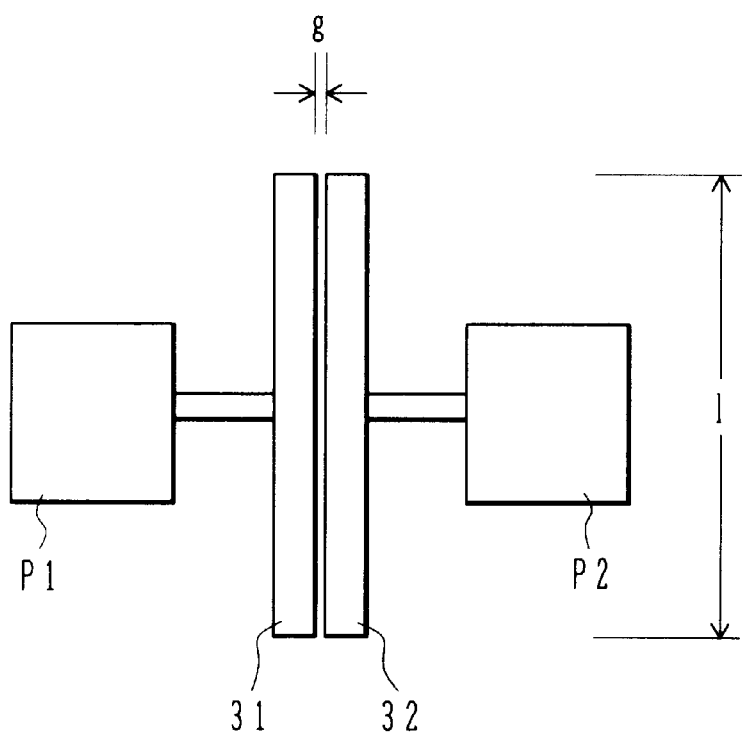

FIGS. 4A and 4B are a cross sectional view and a plan view schematically showing the structure of samples used. FIG. 4A shows the cross sectional structure of samples. On the surface of a silicon substrate 21, a silicon oxide film 28 of 350 nm in thickness was formed, and on this silicon oxide film 28, a ferroelectric layer 29 of 200 nm in thickness made of $SiBi_2Ta_2O_9$ (SBT) were formed. A pair of electrodes 31 and 32 was disposed in parallel at a gap of 0.1 $\mu$m on the upper surface of the ferroelectric layer 29.

FIG. 4B shows a plan pattern of the electrodes 31 and 32. The electrodes 31 and 32 disposed in parallel at the gap of 0.1 $\mu$m are 200 $\mu$m in length, and pads P1 and P2 for voltage application are led from the central areas of the electrodes 31 and 32. In FIG. 4B, the length (200 $\mu$m) of the parallel electrode is represented by 1, and the gap (0.1 $\mu$m) therebetween is represented by g. The electrodes 31 and 32 were made of platinum films.

The dielectric constant of the SBT film is about 200 although it depends on the method of manufacture, and is considerably larger than the dielectric constant of air. Therefore, the capacitance of the ferroelectric capacitor formed between the electrodes 31 and 32 is determined by the dielectric constant and thickness of the ferroelectric layer 29 and the gap and opposing electrode length of the electrodes 31 and 32.

Figure 5A:
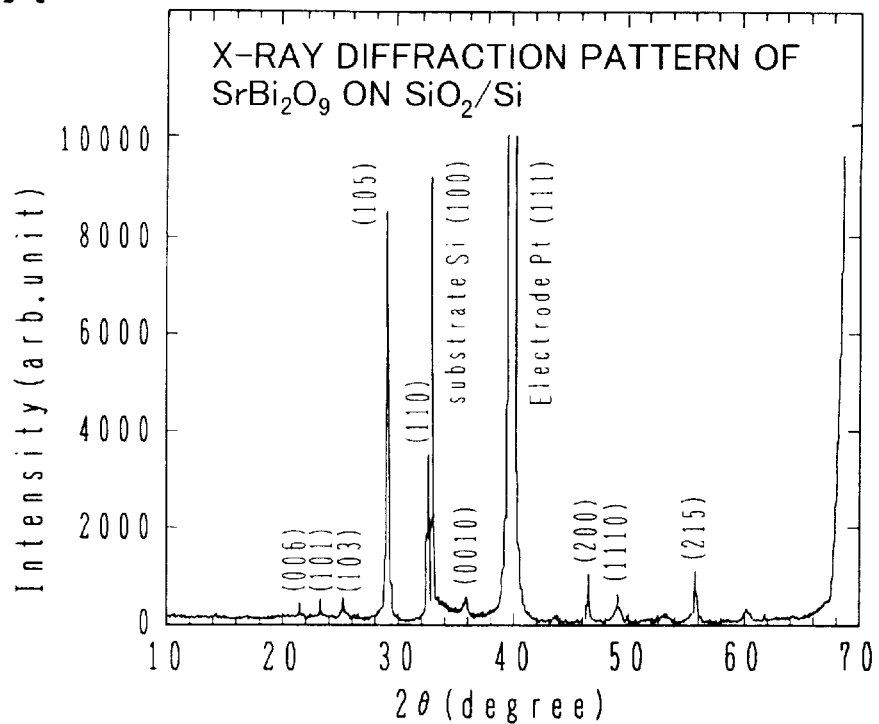
FIGS. 5A and 5B are graphs showing the characteristics of samples shown in FIGS. 4A and 4B.
Figure 5B:
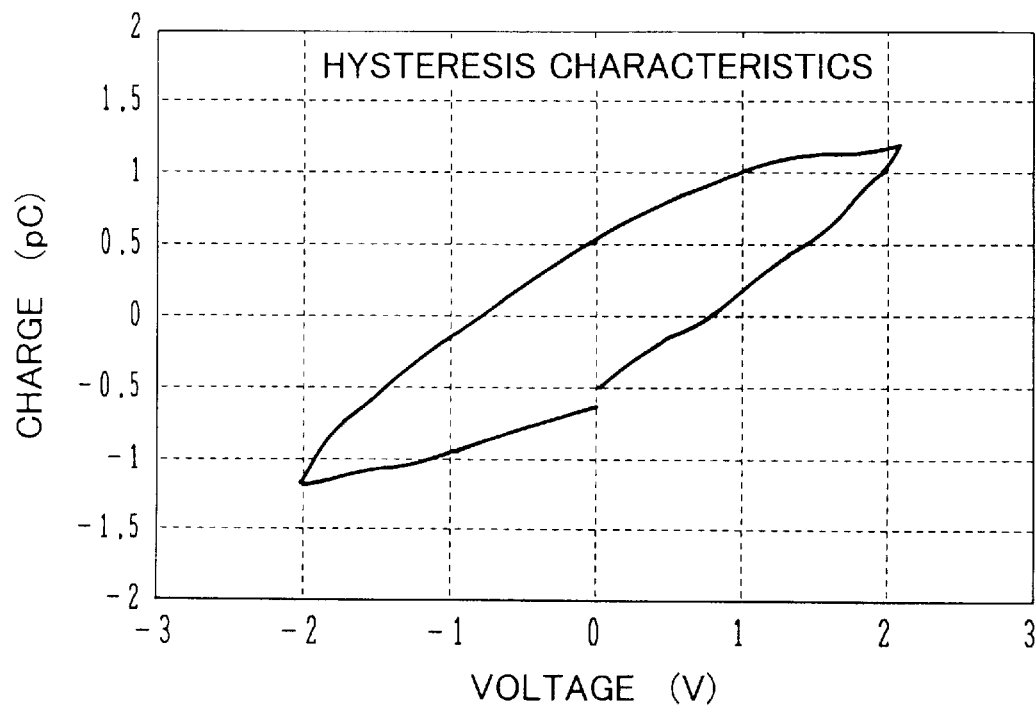

FIGS. 5A and 5B are graphs showing the characteristics of the sample shown in FIGS. 4A and 4B. FIG. 5A shows x-ray diffraction patterns indicating crystallinity of the ferroelectric layer in the lamination structure of the oxide film 28, ferroelectric layer 29, and electrodes 31 and 32 stacked on the silicon substrate 21. The abscissa represents an x-ray diffraction angle 2θ in degree, and the ordinate represents a diffraction intensity in an arbitrary unit.

In the graph of FIG. 5A, SBT diffraction peaks correspond to those peaks excepting a diffraction peak of the (100) plane of the silicon substrate and a diffraction peak of the (111) plane of the Pt electrodes. From this graph, it can be understood that the SBT layer formed on the silicon oxide film is a dielectric layer having good crystallinity. FIG. 5B shows the hysteresis characteristics of the sample shown in FIGS. 4A and 4B. The abscissa represents an applied voltage across the opposing electrodes in the unit of V, and the ordinate represents stored charges in the unit of pC. The charge amounts at the applied voltage V=0 indicate the amounts of residual polarization. As seen from the measured values shown in FIG. 5B, the residual polarization may be estimated as 0.5 pC, which means a residual polarization of 2.5 fC/$\mu$m.

The charge density of about 0.1 $\mu$C/cm$^2$ is sufficient to induce a channel in a semiconductor surface layer of a MOS transistor. If the gate area of a MOS transistor is 1 $\mu$m$^2$, and the charge density is 0.1 $\mu$C/cm$^2$, a charge amount is about 1×10$^{-15}$ C. The opposing capacitor electrode length necessary for operation is about 0.4 $\mu$m from the residual polarization of 2.5 fC/$\mu$m. This size of the capacitor electrodes does not become an obstacle in forming a high integration density ferroelectric memory.

Although the gap between opposing capacitor electrodes of the sample is set to 0.1 $\mu$m, various modifications are possible such as broadening the gap and increasing the opposing electrode length to facilitate manufacturing processes, as will be obvious to those skilled in the art.

With the structure of the sample shown in FIG. 4A, even if polarization of the ferroelectric layer occurs sufficiently strong by thinning the ferroelectric layer 29, the capacitance of the ferroelectric capacitor can be easily suppressed to a desired value. It is also easy to set the drive voltage to a desired value by adjusting the electrode gap and the like.

Figure 1A:
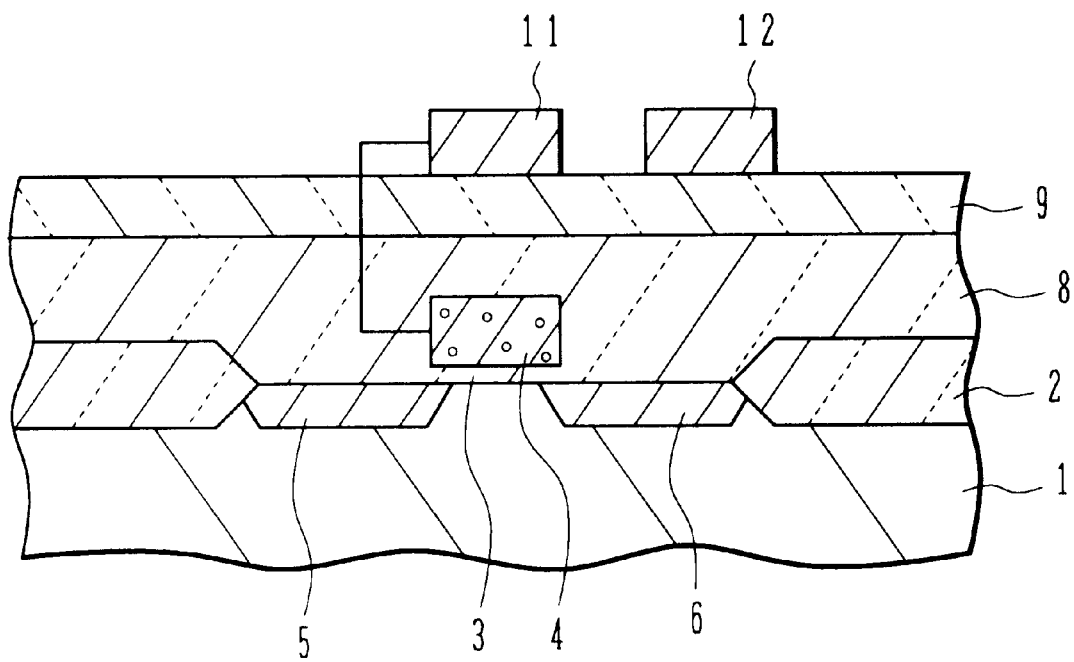
FIGS. 1A and 1B are a cross sectional view of a ferroelectric memory according to an embodiment of the invention, and an equivalent circuit of the memory.
Figure 1B:
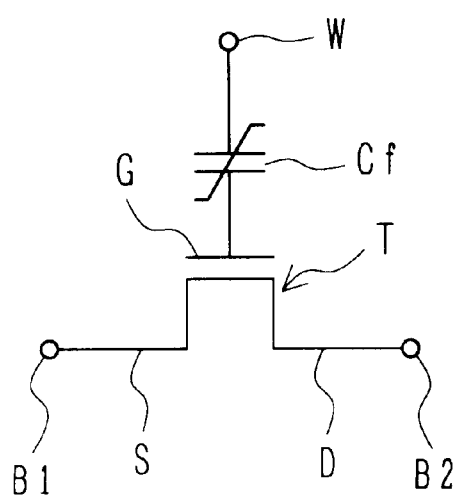

FIGS. 1A and 1B schematically show the structure of a ferroelectric memory according to an embodiment of the invention. FIG. 1A schematically shows the cross sectional structure of the ferroelectric memory cell, and FIG. 1B is an equivalent circuit of the ferroelectric memory cell.

Referring to FIG. 1A, on the surface of a silicon substrate 1 of, for example, p-type, a field oxide film 2 is formed by known LOCOS technique. On the surface of an active region surrounded by the field oxide film 2, a gate oxide film 3 having a thickness of, for example, 10 nm, is formed by thermal oxidation. On the gate oxide film 3, a polysilicon gate electrode 4 is formed to a thickness of, for example, 200 nm. Into the regions on both sides of the gate electrode 4, n-type impurity ions are implanted to from a pair of source/drain regions 5 and 6.

If necessary, side spacers of silicon oxide films or the like may be formed on the side walls of the gate electrode 4 and ions may further be implanted. Wirings to the source/drain regions 5 and 6 may also be formed.

Thereafter, a silicon oxide film 8 is deposited over the substrate by chemical vapor deposition (CVD), the silicon oxide film 8 covering the gate electrode 4. It is preferable that the surface of the silicon oxide film 8 is planarized. On the surface of the silicon oxide film 8, a ferroelectric layer 9 is formed which is made of SBT, Pb(Zr, Ti)O$_3$ (PZT) or the like. For example, the ferroelectric layer 9 is made of an SBT layer having a thickness of 200 nm. Opposing electrodes 11 and 12 made of Pt or the like are formed on the surface of the ferroelectric layer 9. At this time, it is preferable to form a via hole passing through the ferroelectric layer 9 and insulating layer 8 and reaching a partial area of the gate electrode 4, to electrically connect the electrode 11 and gate electrode 4.

The stray capacitance of the electrode 11 can be reduced by disposing the electrode to overlap it with the gate electrode in directions along the substrate surface.

FIG. 1B is an equivalent circuit of the ferroelectric memory formed in the above manner. One electrode of a ferroelectric capacitor C$_f$ is connected to a gate electrode G of a MOS transistor T having a source S, a drain D, and a gate G. The source S and the drain D are connected to a first bit line B1 and a second bit line B2, respectively, and the other electrode of the ferroelectric capacitor $C_f$ is connected to a word line W.

Recorded data can be read by checking conduction between a pair of bit lines B1 and B2. Data can be written in the ferroelectric capacitor $C_f$ by applying a voltage greater than a predetermined value across the bit line or lines B1, B2 and the word line W.

Figure 2A:
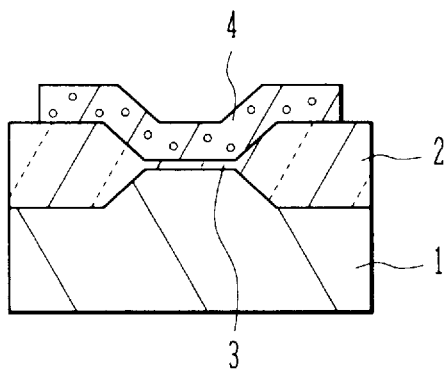
FIGS. 2AV to 2CP are cross sectional views and plan views illustrating manufacture processes for a ferroelectric capacitor shown in FIGS. 1A and 1B.
Figure 2A:
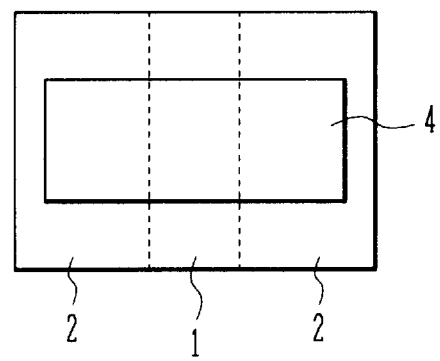

Manufacturing processes of the ferroelectric memory shown in FIG. 1A will be described with reference to FIGS. 2AV to 3CP. In FIGS. 2AV to 3CP, FIGS. 2AV, 2BV, 2CV, 3AV, 3BV, and 3CV are cross sectional views and FIGS. 2AP, 2BP, 2CP, 3AP, 3BP, and 3CP are plan views.

As shown in FIGS. 2AV and 2AP, on the surface of a p-type silicon substrate 1, a field oxide film 2 is formed by LOCOS technique. Thereafter, on the surface of an active region, a gate oxide film 3 having a thickness of 10nm is formed through thermal oxidation. On the surfaces of the field oxide film 2 and gate oxide film 3, a polysilicon layer 4 is deposited to a thickness of about 200 nm by chemical vapor deposition (CVD) for example. This polysilicon layer 4 is doped with n-type impurities, constituting an n-type region.

By using a resist pattern, the polysilicon film 4 is patterned through photolithography to form a gate electrode 4 which extends from the gate oxide film 3 to the field oxide film 2. By using the gate electrode 4 as a mask, n-type impurity ions are implanted to form n-type source/drain regions (Refer to FIG. 1A). For example, the ion implantation is performed generally in a vertical direction by using As ions under the conditions of an acceleration energy of AB keV and a V of $1 \times 10^{15}$ cm$^{-2}$.

Figure 2B:
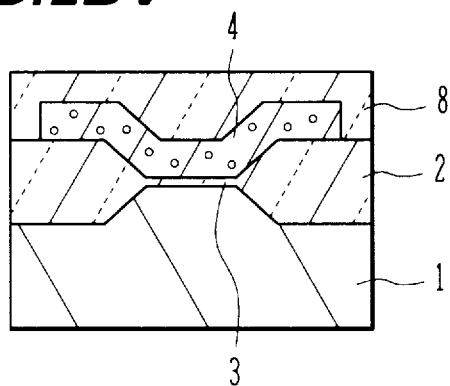
Figure 2B:
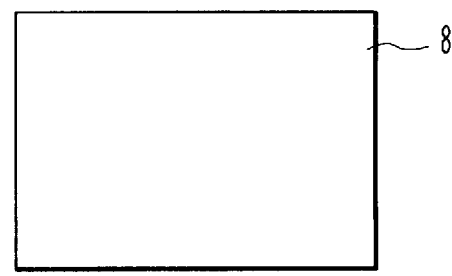

As shown in FIGS. 2BV and 2BP, a silicon oxide film 8 is deposited over the substrate by chemical vapor deposition (CVD), the silicon oxide film 8 covering the gate electrode 4. After the silicon oxide film 8 is formed, the surface of this film 8 is planarized by chemical mechanical etching (CMP). For example, CMP is performed by using a polishing agent, product name SC112 manufactured by RODEL corporation.

Figure 2C:
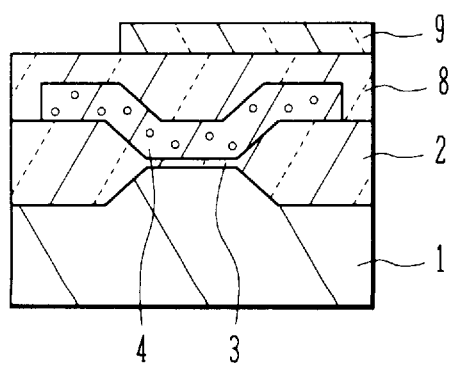
Figure 2C:
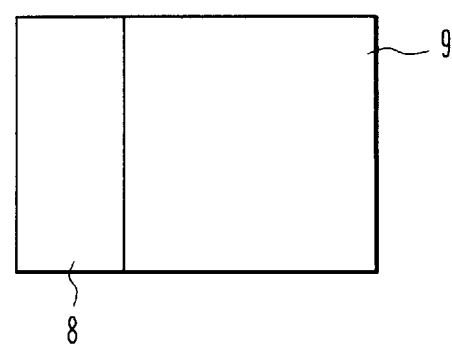

As shown in FIG. 2CV and 2CP, on the planarized surface of the silicon oxide film 8, an SBT layer 9 having a thickness of, for example, 200 nm, is formed. The SBT layer may be formed by a sol/gel method for example. Metal alkoxide mixed solution as a starting material is spin-coated over the substrate surface and dried at a temperature of 250° C. This process is repeated four times, and thereafter annealing for crystallization is performed for 30 minutes at a temperature of 800° C. in an $O_2$ atmosphere.

A resist pattern is formed on the ferroelectric layer 9 and this layer 9 is patterned to form the capacitor ferroelectric layer 9, for example, by reactive ion etching (RIE) using a mixture gas of $CF_4$ and Ar.

Figure 3A:
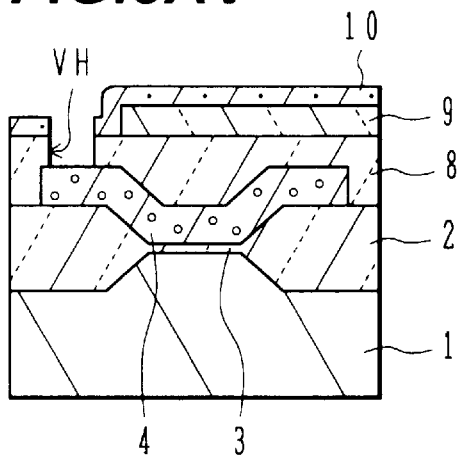
FIGS. 3AV to 3CP are cross sectional views and plan views illustrating manufacture processes for the ferroelectric capacitor shown in FIGS. 1A and 1B.
Figure 3A:
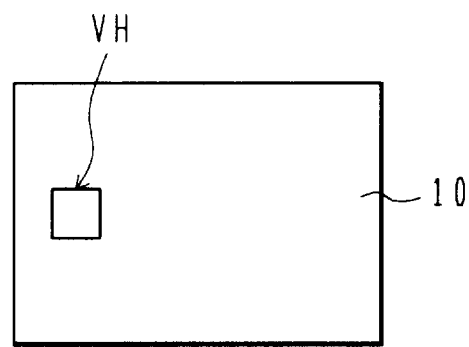

As shown in FIGS. 3AV and 3AP, a silicon oxide film 10 is formed by CVD, covering the ferroelectric layer 9. A resist pattern is formed on the surface of the silicon oxide film 10, and a via hole VH reaching the gate electrode 4 is formed. Thereafter, the resist pattern is removed.

Figure 3B:
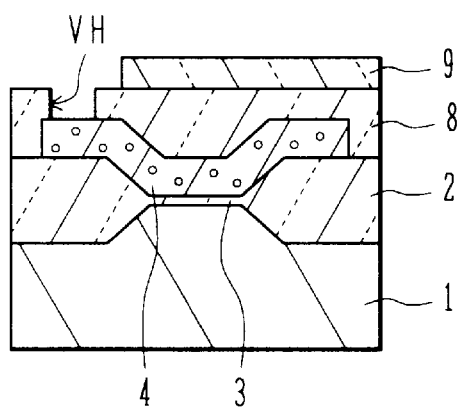
Figure 3B:
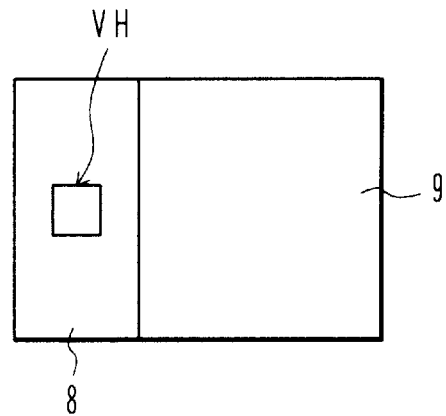

As shown in FIGS. 3BV and 3BP, the CVD silicon oxide film 10 is removed. In this case, although it is inevitable that as the silicon oxide film 10 is etched, the silicon oxide film 8 is etched slightly, it is possible to hardly change the shape of the silicon oxide film 8 by setting the thickness of the silicon oxide film 10 thin.

Figure 3C:
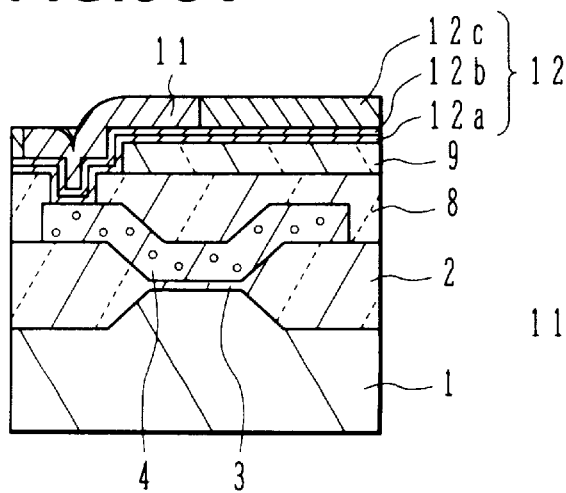
Figure 3C:
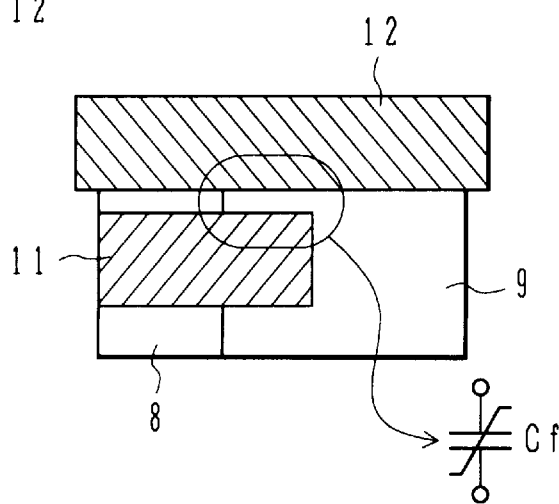

As shown in FIGS. 3CV and 3CP, a laminated wiring layer made of a Ti layer 12a, a TiN layer 12b, and an Al layer 12c is formed over the surface of the substrate formed with the via hole VH, and patterned to form capacitor opposing electrodes 11 and 12. The Ti layer 12a improves tight adhesion, and the TiN layer 12b functions as a barrier layer for preventing solid phase diffusion.

As shown in FIG. 3CP, a ferroelectric capacitor $C_f$ is formed in a region in the surface layer of the ferroelectric layer 9 across which region the electrodes 11 and 12 are opposing.

Although the capacitor dielectric layer is described to be made of SBT, other ferroelectric materials may be used. For example, PZT may be used in place of SBT. Although SBT has a large dielectric constant, PZT has a dielectric constant greater than that of SBT. It is preferable that the ferroelectric material of the ferroelectric layer has a dielectric constant tenfold or more as large as that of the underlying insulating film (if it is silicon oxide, the dielectric constant is about 4). Since approximately only the ferroelectric layer is used as the capacitor dielectric layer, it is preferable that the gap between the opposing electrodes 11 and 12 is a threefold or less of the thickness of the ferroelectric layer 9. If the ferroelectric capacitor is to be electrically isolated from the underlying semiconductor device structure, it is preferable that the thickness of the insulating film 8 is 10 nm or thicker even in the thinnest region of the film 8.

In this embodiment, the upper portion of the MOS transistor is covered with the insulating layer 8 and ferroelectric layer 9, and the opposing electrodes 11 and 12 are formed on the upper surface of the ferroelectric layer 9. Although it is necessary to form the opposing electrodes 11 and 12 on the surface of the ferroelectric layer 9, it is not always necessary to form them on the upper surface of the ferroelectric layer 9.

Figure 6:
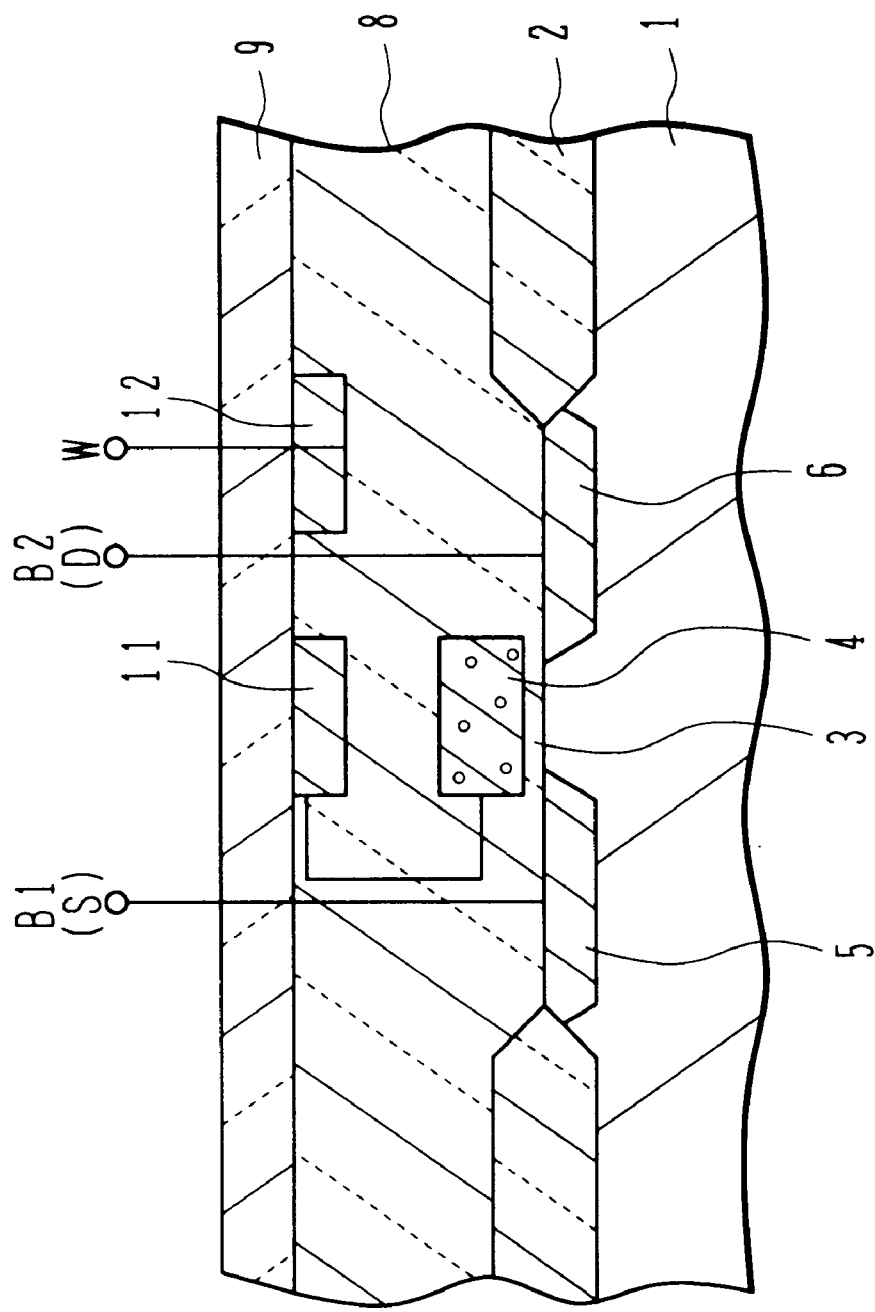
FIG. 6 is a cross sectional view of a ferroelectric memory according to another embodiment of the invention.

FIG. 6 is a cross sectional view showing the structure of a ferroelectric memory according to another embodiment of the invention. In this embodiment, similar to the embodiment shown in FIG. 1, after a field oxide film 2 is formed on the surface of a silicon substrate 1, a MOS transistor having a gate insulating film 3, a gate electrode 4, a source region 5, and a drain region 6 is formed in and above an active region surrounded by the field oxide film 2, and an insulating layer 8 is formed over the substrate. Opposing electrodes 11 and 12 are formed in the surface layer of the insulating layer 8, the surfaces of the opposing electrodes 11 and 12 being flush with the surface of the insulating layer 8.

For example, this structure can be formed by first depositing a portion of the insulating film 8, forming the opposing electrodes on the surface of the partially deposited film 8, forming the remaining portion of the insulating film 8 covering the opposing electrodes 11 and 12, and performing a planarizing process.

A ferroelectric layer 9 is formed covering the surfaces of the opposing electrodes 11 and 12 and the insulating layer 8. In the above manner, a ferroelectric memory of FIG. 6 having the opposing electrodes 11 and 12 buried in the insulating film 8 can be formed.

Figure 7:
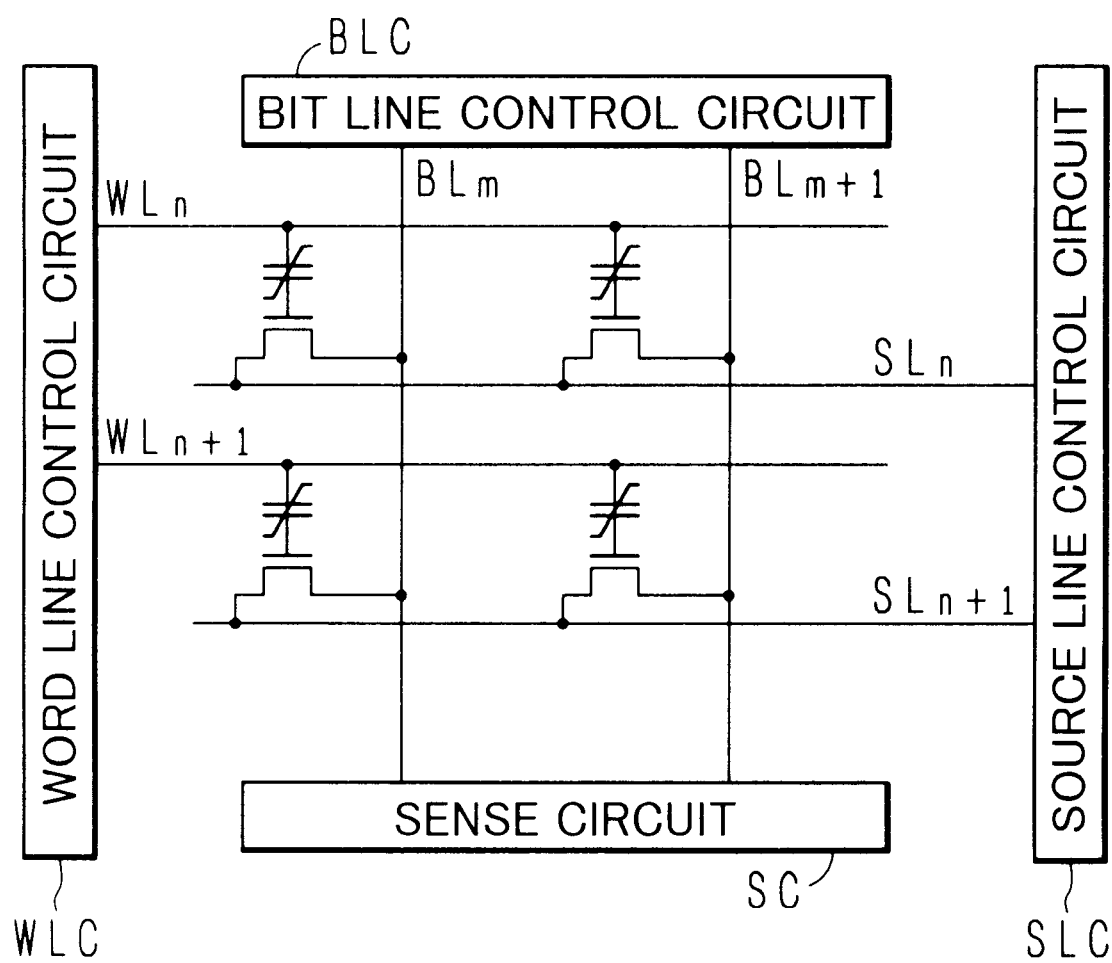
FIG. 7 is a schematic diagram showing an equivalent circuit of a ferroelectric memory device.

FIG. 7 is a schematic circuit diagram of a ferroelectric memory device using ferroelectric memories such as shown in FIG. 6. A plurality of bit lines $BL_m$, $BL_{m+1}$, . . . are disposed in the vertical direction in FIG. 7, and a plurality of word lines $WL_n$, $WL_{n+1}$, . . . are disposed in the horizontal direction. A plurality of source lines $SL_n$, $SL_{n+1}$, . . . are disposed in the horizontal direction.

The bit line BL is connected to a bit line control circuit BLC and to a sense circuit SC. The word line WL is connected to a word line control circuit WLC. The source line is connected to a source line control circuit SLC.

The bit line control circuit BLC, the word line control circuit WLC, and the source line control circuit SLC control the potentials on the bit line BL, the word line WL, and the source line SL, respectively. The sense circuit SC detects current flowing through the bit line BL.

Various modifications may be made to the ferroelectric memories shown in FIG. 1A and FIG. 6. For example, instead of a MOS transistor, other insulated-gate field effect transistors may be used. Ferroelectric materials other than SBT and PZT may be used. Conductive materials other than Pt may be used as the material of the ferroelectric capacitor electrodes. Various other modifications are also possible. The circuit configuration of a memory cell is not limited only to that shown in FIG. 7.

Figure 9A:
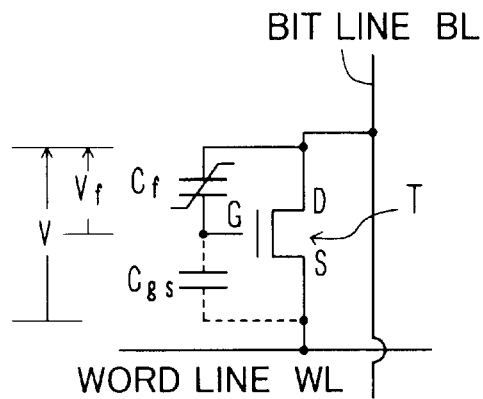
FIGS. 9A to 9D are a circuit diagram of a memory cell according to an embodiment of the invention and graphs showing the characteristics of the memory cell.
Figure 9B:
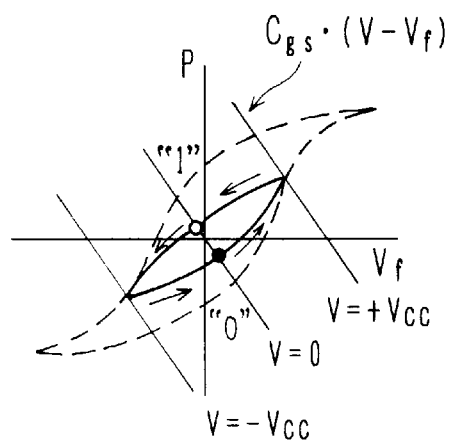
Figure 9C:
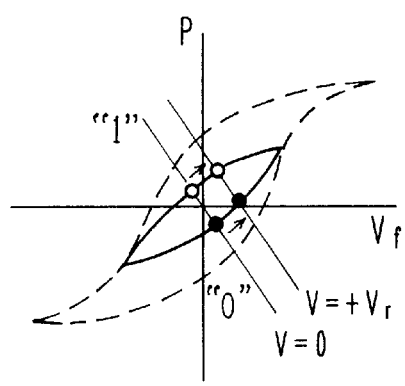
Figure 9D:
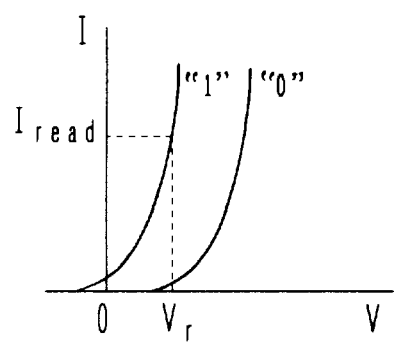

FIGS. 9A to 9D illustrate a novel memory cell according to an embodiment of the invention. FIG. 9A is a circuit diagram of one memory cell, FIGS. 9B and 9C are graphs illustrating write and read operations, and FIG. 9D is a graph illustrating read current.

Referring to FIG. 9A, an insulated-gate field effect transistor T has an insulated gate G, a source S, and a drain D. A ferroelectric capacitor $C_f$ is connected across the insulated gate G and the drain D. In this manner, a diode-connection insulated-gate field effect transistor is formed.

Another capacitor $C_{gs}$ is connected across the insulated gate G and the source S. This capacitor $C_{gs}$ is not necessary to be connected externally, but a stray or parasitic capacitor formed between the insulated gate G and the source S may be used. A coupling ratio $R=C_{gs}/(C_{gs}+C_f)$ of a voltage across the ferroelectric capacitor $C_f$ to a voltage applied between the source S and the drain D is preferably set to 0.2 or higher. The drain D is connected to the bit line BL, and the source S is connected to the word line WL.

In the following description, it is assumed that the insulated-gate field effect transistor T is of an n-channel. As a voltage V is applied across the source S and the drain D, this voltage V is divided by the two capacitors $C_{gs}$ and $C_f$. A voltage appearing across the ferroelectric capacitor $C_f$ is represented by $V_f$.

FIG. 9B shows polarization P relative to the voltage $V_f$ across the ferroelectric capacitor $C_f$. A hysteresis curve shown by a broken line indicates the hysteresis characteristics when the polarization is formed to a sufficiently saturated state. A hysteresis curve shown by a solid line indicates the hysteresis characteristics used by a memory operation. Three straight lines $C_{gs}\cdot(V-Vf)$ are load lines when the capacitor $C_{gs}$ is used as a load and the voltages V=+Vcc, 0, and −Vcc are applied across the source S and the drain D. After +Vcc is applied once, residual polarization "1" is left even if the applied voltage V is returned to 0 V, whereas after −Vcc is applied once, residual polarization "0" is left even if the applied voltage V is returned to 0 V.

FIG. 9C is a graph illustrating read characteristics. It is assumed herein that the ferroelectric capacitor $C_f$ has residual polarization as shown in FIG. 9B. In reading data from the memory, a voltage +Vr smaller than the write voltage +Vcc is applied. In the state that the read voltage +Vr is applied, if the ferroelectric capacitor $C_f$ stores data "0", the polarization of the ferroelectric capacitor $C_f$ becomes zero, whereas if it stores data "1", positive polarity polarization further increases. The conductivity of the insulated-gate field effect transistor T changes with a difference in polarization amounts, so that stored data can be read.

FIG. 9D is a graph showing a change in read current. The abscissa represents an applied voltage V, and the ordinate represents a current I flowing through the insulated-gate field effect transistor T. If the written data is "1", a channel is already formed by the residual polarization. Therefore, as the voltage V is raised, the current I increases immediately.

On the contrary, if the written data is "0", the current I does not flow immediately after the voltage V is applied. Only a small current flows when the applied voltage V is the read voltage Vr. As above, a difference between currents I flowing through the transistor T depends upon whether the written data is "1" or "0". By detecting this current difference, the data can be read. When data is written, it is preferable to apply a pulse voltage in order to lower power consumption.

Figure 10A:
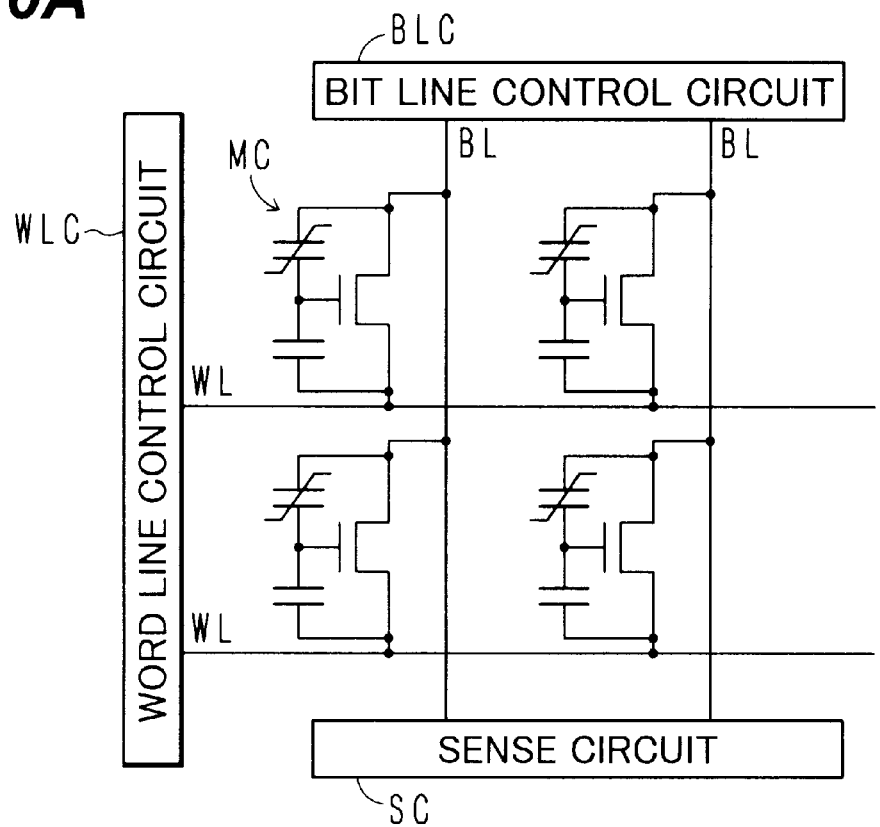
FIGS. 10A and 10B are a schematic diagram showing a circuit of a memory cell array according to an embodiment of the invention, and a timing chart of a cell selection and data write.
Figure 10B:
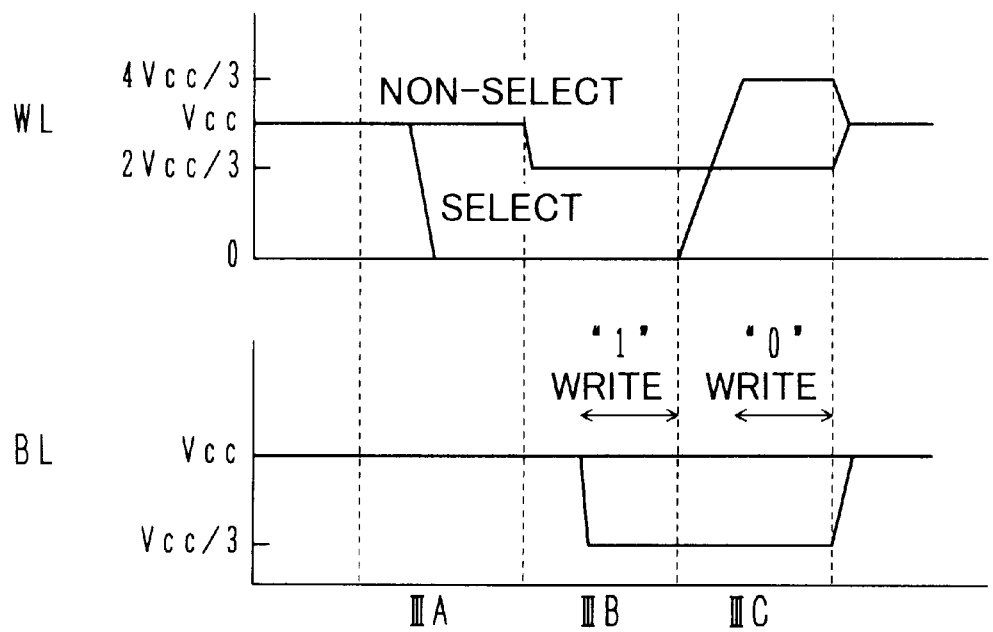

FIGS. 10A and 10B illustrate the structure and operation of a memory cell array. FIG. 10A is a schematic block diagram showing the structure of the memory cell array, and FIG. 10B is a graph showing voltages applied to the word line WL and bit line BL. Although pulse voltage pulses are applied in actual, the voltage is drawn in FIG. 10B something like a d.c. voltage waveform in order to simplify the description.

Referring to FIG. 10A, a plurality of bit lines BL are disposed in parallel in the vertical direction. A plurality of word lines WL are disposed in parallel in the horizontal direction, crossing the bit lines BL. At each cross point of the bit line BL and word line WL, a memory cell MC shown in FIG. 9A is connected. The bit line BL is connected to a bit line control circuit BLC which supplies a bit line control signal. The bit line BL is also connected to a sense circuit SC at the lower end in FIG. 10A which detects current flowing through the bit line. The word line WL is connected to a word line control circuit WLC which supplies a word line control signal.

In reading data from the memory array, a read voltage Vr such as shown in FIG. 9D is applied across the bit line BL and the word line WL connected to the memory cell to be read, and a voltage smaller than the read voltage Vr is applied relative to the other memory cells from which data is not read. In this manner, the data in a desired memory cell can be read.

FIG. 10B shows write signal waveforms. Signals having waveforms shown in the upper area of FIG. 10B are applied to the word line WL, and signal having waveforms shown in the lower area of FIG. 10B are applied to the bit line BL. The signal waveform on the word line WL has four levels including a ground potential 0, a reference voltage Vcc, 2 Vcc/3, and 4 Vcc/3. The signal waveform on the bit line BL has two levels including the reference potential Vcc and Vcc/3.

Consider now that one word line is selected and data is written in memory cells connected to the selected word line. A time cycle IIIA shows a select state of the word line. The potential of the selected word line is set to the ground level 0, and the non-selected word lines are set to the reference potential Vcc. All the bit lines BL are set to the reference potential Vcc.

Figure 11A:
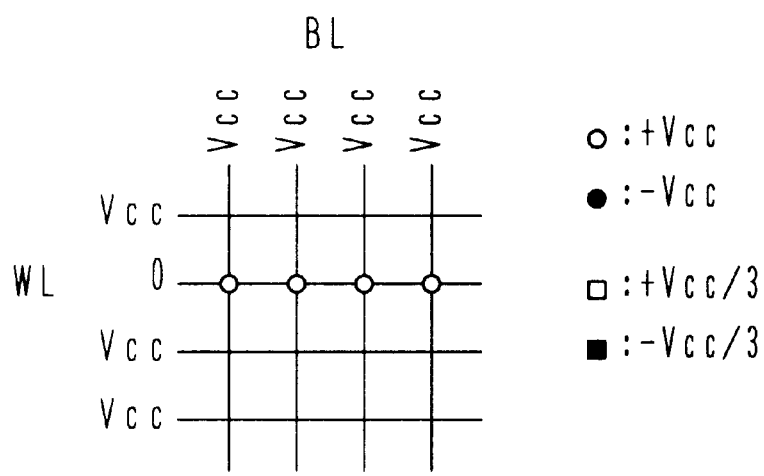
FIGS. 11A to 11C are schematic plan views illustrating the operations of the memory cell array shown in FIG. 10A which is driven with signals having the waveforms shown in FIG. 10B.

FIG. 11A shows a word line select state. Only the selected word line WL is given the ground potential 0, and the other word lines and all the bit lines are given the reference voltage Vcc. All the memory cells connection to the selected word line are therefore given the voltage +Vcc. This applied voltage writes "1" in all the memory cells connection to the selected word line.

Referring back to FIG. 10B, as the time cycle changes from the time cycle IIIA to a time cycle IIIB, the potential of the non-selected word line is changed to 2 Vcc/3 lower than the reference voltage Vcc, while the potential of the selected word line WL is maintained at the ground potential. The bit lines BL to be used for writing "1" are maintained at the reference potential Vcc, and the potentials of the other bit lines are changed to Vcc/3.

Figure 11B:
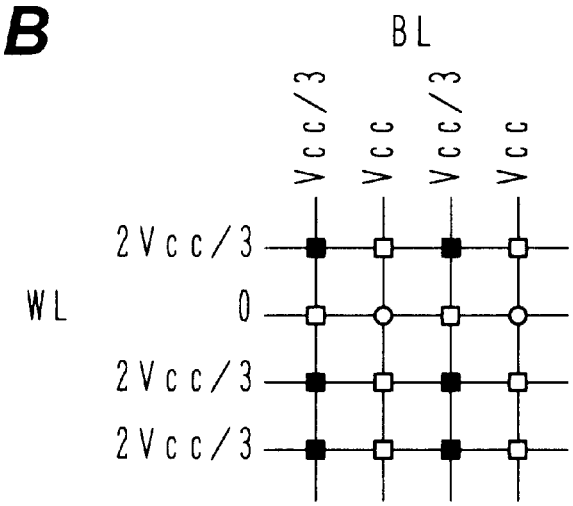

FIG. 11B shows a state of the time cycle IIIB. The memory cells at the bit lines to be written with "1" are maintained at +Vcc, whereas the other memory cells are given +Vcc/3 or −Vcc/3. With this voltage application scheme, the memory cells to be written with "1" are reliably written with "1" without greatly influencing the states of the other memory cells.

In FIG. 10B, as the time cycle changes from the time cycle IIIB to a time cycle IIIC, the potential of the selected word line is changed from the ground potential to 4 Vcc/3, whereas the potentials of the non-selected word lines are not changed. The potentials of the bit lines BL are maintained unchanged from the time cycle IIIB.

Figure 11C:
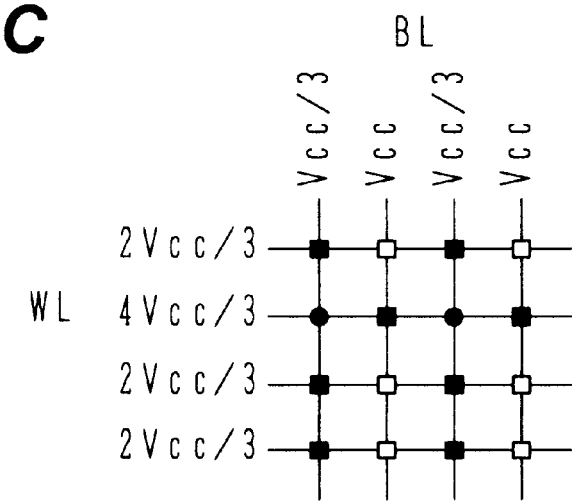

FIG. 11C shows a state of the time cycle IIIC. As the potential of the selected word line is changed from 0 to 4Vcc/3, of the memory cells connected to the selected word line, the memory cells other than the memory cells written with "1", i.e., the memory cells to be written with "0", are set to −Vcc to write "0". The other memory cells are set to the potential of +Vcc/3 or −Vcc/3.

By executing the above write method, the write characteristics having a large disturb resistance can be obtained. Since the data write of "1" and "0" can be realized only by changing the potential of the selected word line WL, the circuit structure of the memory array can be simplified.

Figure 12A:
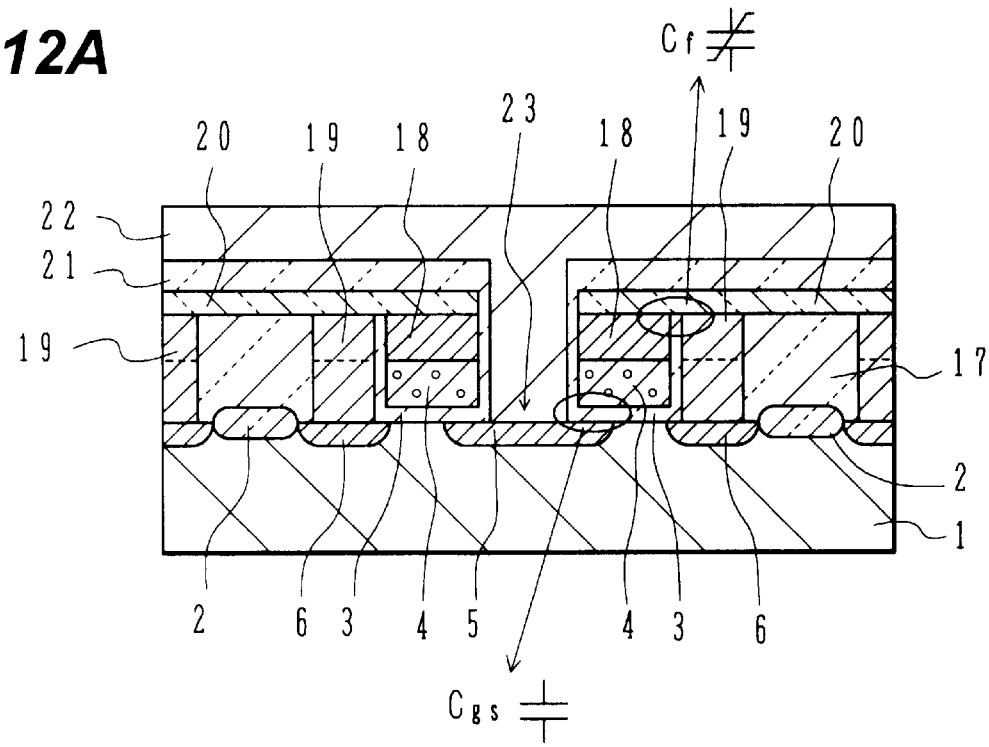
FIGS. 12A and 12B are a cross sectional view and a plan view showing the structure of a ferroelectric memory device according to an embodiment of the invention.
Figure 12B:
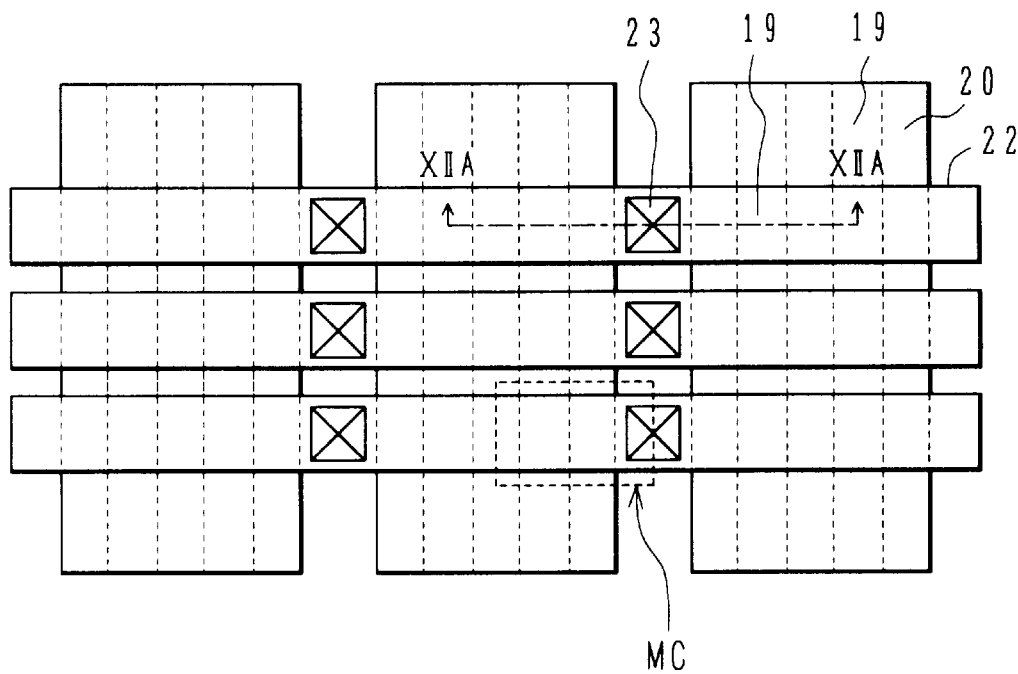

FIGS. 12A and 12B show the structure of memory cells suitable for realizing the memory array circuit shown in FIG. 10A. FIG. 12A is a cross sectional view of the memory cells, and FIG. 12B is a plan view of the memory cells. The cross sectional view of FIG. 12A corresponds to a cross section taken along line XIIA—XIIA shown in FIG. 12B.

On the surface of a p-type silicon substrate 1, a field oxide film 2 is formed by well known LOCOS. A pair of insulated-gate field effect transistors is formed in an active region surrounded by the field oxide film 2.

As the insulated-gate field effect transistor, MOS transistor is used for example. After the gate oxide film 3 is formed in each active region, a pair of gate electrodes 4 of polysilicon is formed on the gate oxide film 3. On the gate electrode 4, a bottom electrode 18 is formed which has a property suitable for the electrode of a ferroelectric capacitor. In the structure shown in FIG. 12A, the gate electrode 4 and bottom electrode 18 collectively constitute a gate electrode structure.

By using the gate electrode structure as a mask, ion implantation is performed for forming source and drain regions 5 and 6. In this case, in order to increasing a coupling ratio R by increasing the gate-source capacitance $C_{gs}$, the ion implantation is performed twice separately for the source region 5 and the drain region 6.

For example, an area where the drain region is formed is masked by a resist mask or the like, and while the substrate is rotated, As ions are implanted under the conditions of an incidence angle of 60 degrees, an acceleration energy of 60 keV, and a dose of $1 \times 10^{15}$ cm$^{-2}$. At the incidence angle of 60 degrees, implanted As ions distribute also under the gate electrode. Therefore, the capacitance $C_{gs}$, can be positively formed between the source region 5 and the gate electrode 4.

An area where the source region is formed is masked by a resist mask or the like to expose an area where the drain region is formed, and As ions are implanted generally along a vertical direction to the substrate surface under the conditions of an acceleration energy of 30 keV and a dose of $1 \times 10^{15}$ cm$^{-2}$. With this ion implantation, a pair of drain regions is formed. Since ions are implanted generally along the vertical direction, although the drain region 6 extends more or less under the gate electrode 4, an overlap amount (area, projected upon the substrate surface) between the drain region 6 and the gate electrode 4 becomes considerably small as compared to an overlap amount (area) between the source region 5 and the gate electrode 4. Therefore, the source-gate capacitance is larger than the drain-gate capacitance.

An insulating film 17 is formed over the substrate surface and openings reaching the drain regions 6 are formed through this film 17. In this opening, a bit line 19, which also serves as the drain electrode, is formed. The bit line 19 also serves as the bottom electrode of the ferroelectric capacitor. The surfaces of the bottom electrode on the insulated gate electrode, the insulating film 17, and the bit lines 19 are polished to form a planarized single surface on which a ferroelectric layer 20 is formed. Since the ferroelectric layer 20 is formed on the flat surface, the characteristics of the ferroelectric layer 20 are likely to be stabilized. After the ferroelectric layer 20 is formed, unnecessary portions of this layer 20 are removed according to necessity.

Another insulating layer 21 is formed covering the ferroelectric layer 20. An opening reaching the source region 5 is formed through the insulating layers 21 and 17, and a word line 22 electrically connected to the source region 5 via the opening is formed.

As shown in FIG. 12B, the word lines 22 extend in the horizontal direction of the figure, and the ferroelectric layer 20 lies under the word lines 22. The bit lines 19 extend in the vertical direction under the ferroelectric layer 20. A contact hole 23 is a contact area between the word line 22 and the source region 5. One memory cell MC is indicated in an area surrounded by a broken line.

Manufacture processes for the memory cells shown in FIGS. 12A and 12B will be described with reference to FIGS. 13A to 15C.

Figure 13A:
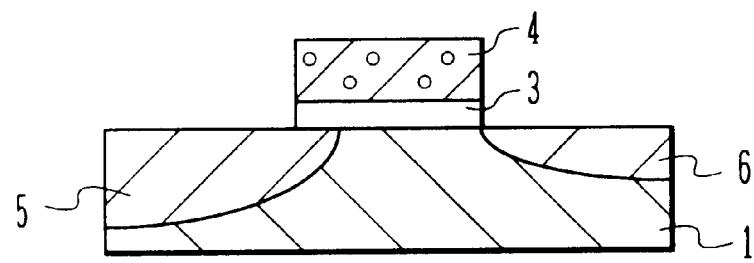
FIGS. 13A to 13D, 14A to 14C, and 15A to 15C are cross sectional views illustrating manufacture processes for the ferroelectric memory device shown in FIGS. 12A and 12B.

As shown in FIG. 13A, after a field oxide film is formed on the surface of a p-type silicon substrate 1, a gate oxide film 3 is formed on which a polysilicon layer is deposited to a thickness of about 200 nm. The polysilicon layer is patterned to form a gate electrode 4. By using the gate electrode 4 and, if necessary, a resist pattern as a mask, ions are implanted to form source and drain regions 5 and 6.

In order to increase the overlap amount between the gate electrode 4 and the source region 5, As ions are implanted into the source region 5 under the conditions of an incidence angle of 60 degrees, an acceleration energy of 60 keV, and a dose of $1 \times 10^{15}$ cm$^{-2}$, whereas As ions are implanted along the vertical direction into the drain region 6 under the conditions of an acceleration energy of 30 keV and a dose of $1 \times 10^{15}$ cm$^{-2}$.

Figure 13B:
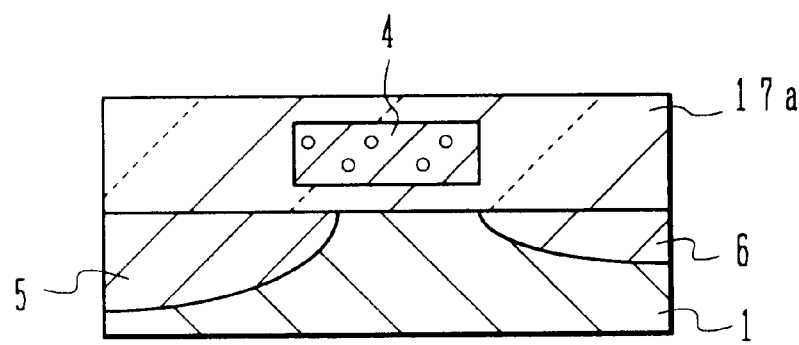

As shown in FIG. 13B, a silicon oxide film 17a is formed by CVD, covering the gate electrode 4. After the silicon oxide film 17a is formed, the surface of the film 17a is planarized by chemical mechanical polishing (CMP).

Figure 13C:
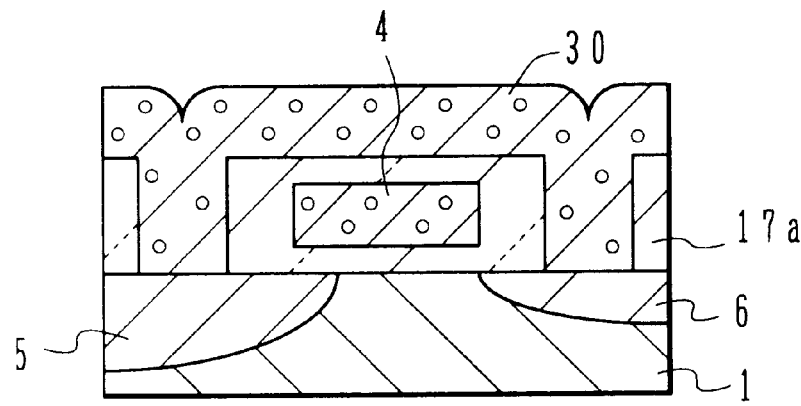

As shown in FIG. 13C, openings are formed through the silicon oxide film 17a to expose the surfaces of the source and drain regions 5 and 6, and a polysilicon layer 30 is deposited by CVD over the substrate surface to bury the openings.

As shown in FIG. 13D, CMP is again performed on the surface of the polysilicon layer 30. This CMP forms a common flat surface of the gate electrode 4, the silicon oxide layer 17a, and the polysilicon plugs 30a and 30b connected to the source and drain regions 5 and 6.

Figure 14A:
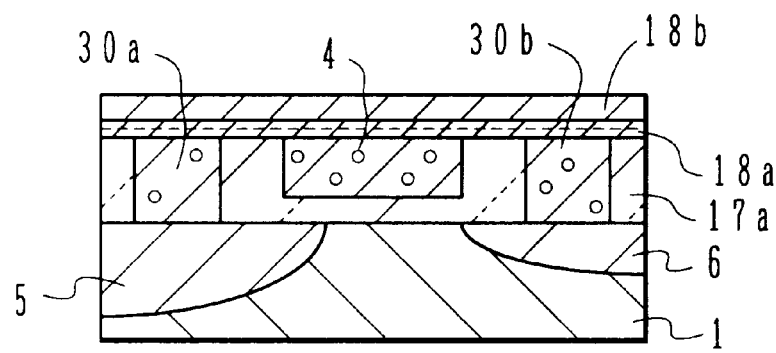

As shown in FIG. 14A, on the common flat surface of the substrate, a lower electrode 18a made of a TiN/Ti lamination and a main electrode 18b made of Pt are formed. Of the lower electrode 18a, the Ti layer improves tight adhesion, and the TiN layer functions as a diffusion barrier layer. The main electrode 18b of Pt forms an electrode excellent in a contact performance with ferroelectric material.

Figure 14B:
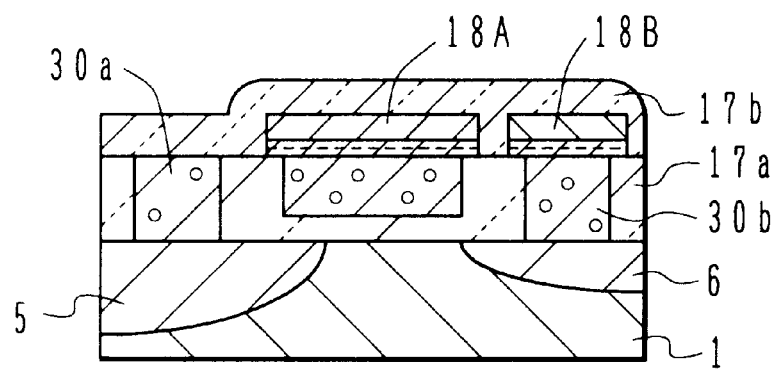

As shown in FIG. 14B, a resist pattern is formed on the lamination of the electrodes 18a and 18b, and the lamination is patterned to form a bottom electrode 18A connected to the gate electrode 4 and a bottom electrode 18B connected to the drain region. This patterning may be performed by reactive ion etching (RIE) using a mixture gas of $CF_4$ and Ar, for example.

After the electrodes 18A and 18B are patterned, a silicon oxide film 17b is deposited by CVD to fully cover the bottom electrodes.

Figure 14C:
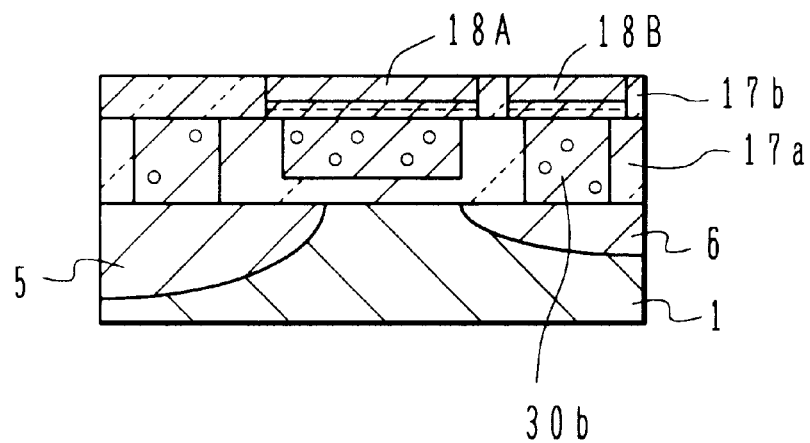

As shown in FIG. 14C, CMP is performed on the surface of the silicon oxide film 17b to planarize it and expose the bottom electrodes 18A and 18B.

Figure 15A:
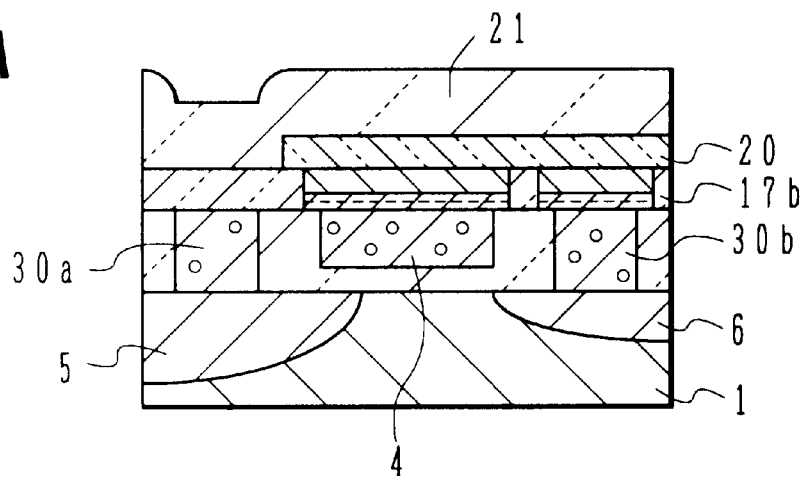

As shown in FIG. 15A, on the planarized surface, an $SrBi_2Ta_2O_9$ (SBT) layer 20 is formed to a thickness of, for example, 200 nm. The SBT layer may be formed by a sol/gel method for example. Mixed alkoxide solution as a starting material is spin-coated over the substrate surface and dried at temperature of 250° C. This coating and dry process is repeated four times to form a coated film having a desired thickness. Thereafter, annealing for crystallization is performed for 30 minutes at a temperature of 800° C. in an $O_2$ atmosphere.

With the above process, the SBT layer excellent in the ferroelectric characteristics can be formed. After the SBT layer 20 is formed, a resist pattern is formed on the surface of the SBT layer, and this layer is patterned. This patterning may be performed by reactive ion etching (RIE) using a mixture gas of $CF_4$ and Ar. After the ferroelectric layer 20 is patterned, a silicon oxide film 21 is deposited by CVD, covering the surface of the patterned ferroelectric layer 20.

Figure 13D:
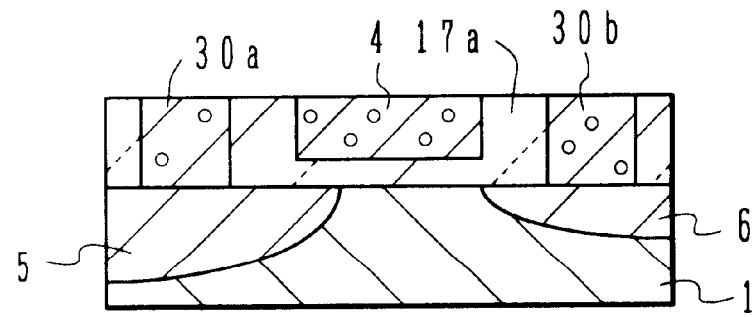
Figure 15B:
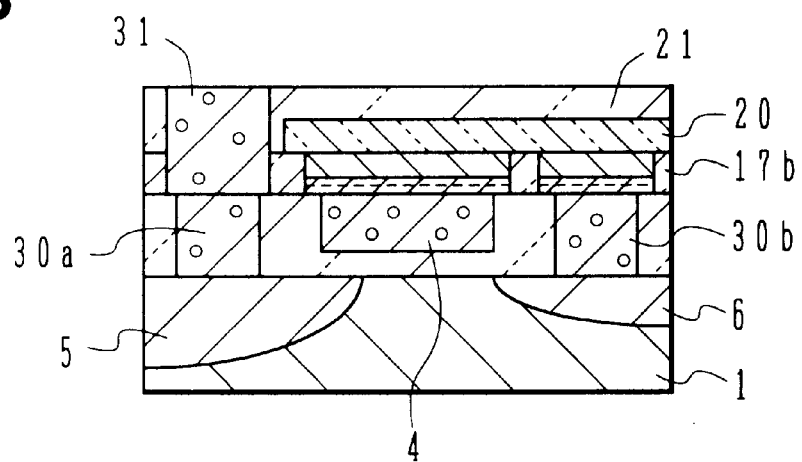

As shown in FIG. 15B, an opening is formed through the silicon oxide films 21 and 17b by photolithography, to expose the surface of the plug 30a connected to the source region 5. The opening is buried with a polysilicon layer deposited by CVD, and CMP similar to that in FIG. 13D is performed to form a planarized surface. A source extracting electrode 31 is therefore formed in the opening.

Figure 15C:
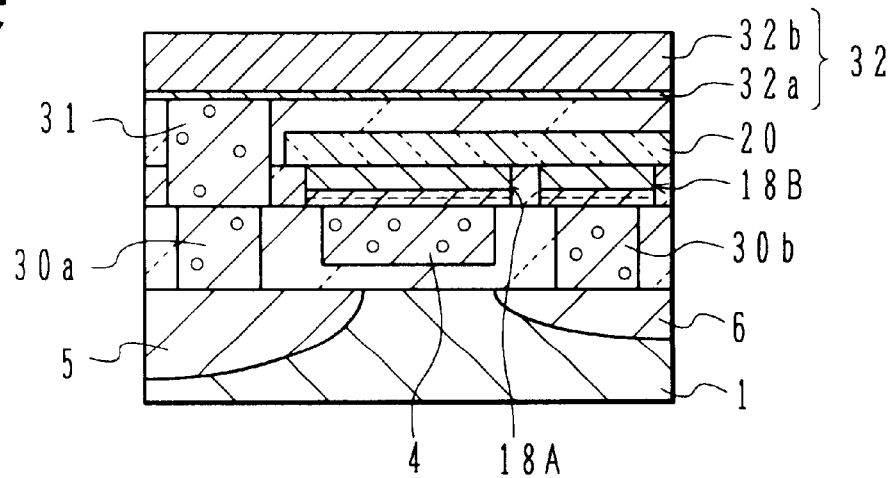

As shown in FIG. 15C, a lamination wiring layer made of a lower wiring layer 32a and a main wiring layer 32b is formed on the planarized surface. The lower wiring layer 32a may be a lamination of TiN/Ti, and the main wiring layer 32b may be made of Al or Al alloy. The lamination wiring layer is patterned to form a word wiring 32.

With the above-described manufacture processes, important constituents of the memory cell are formed on the planarized surfaces, so that stable characteristics of the memory cell can be easily obtained. Furthermore, since the ferroelectric capacitor is formed over the MOS transistor structure, an area occupied by each memory cell can be made small.

In the structure shown in FIG. 12A, the ferroelectric capacitor is formed by disposing electrodes on the lower surface of the ferroelectric layer. The ferroelectric capacitor may also be formed by disposing electrodes on the upper surface of the ferroelectric layer.

Figure 16A:
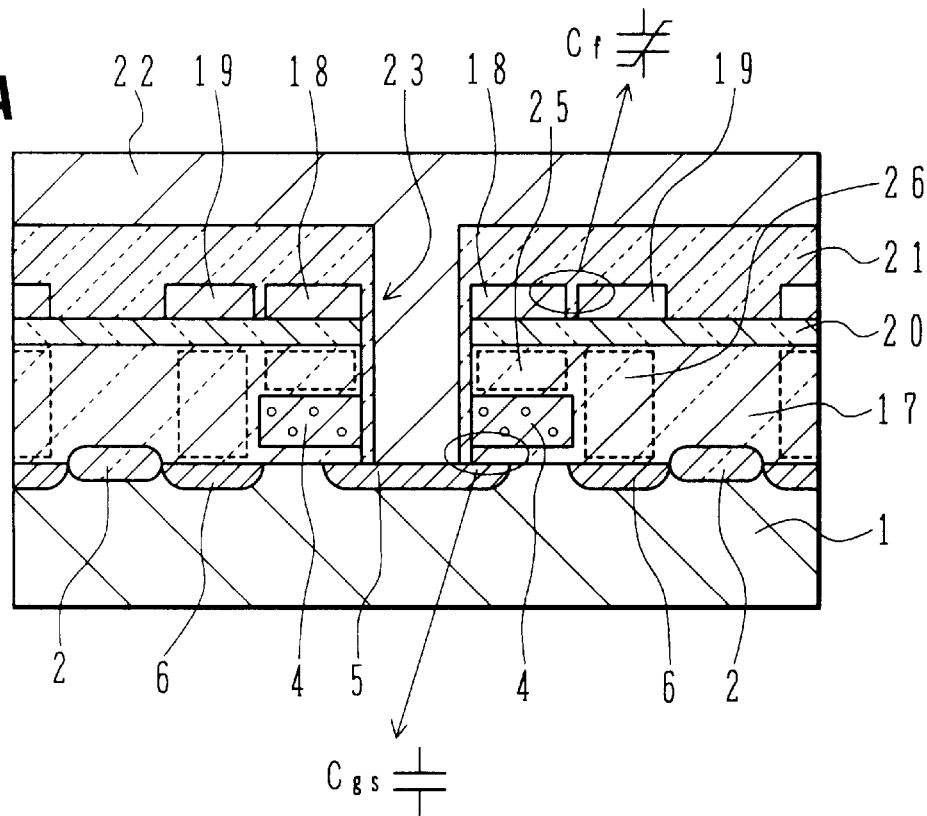
FIGS. 16A and 16B are a cross sectional view and a plan view showing the structure of a ferroelectric memory device according to an embodiment of the invention.
Figure 16B:
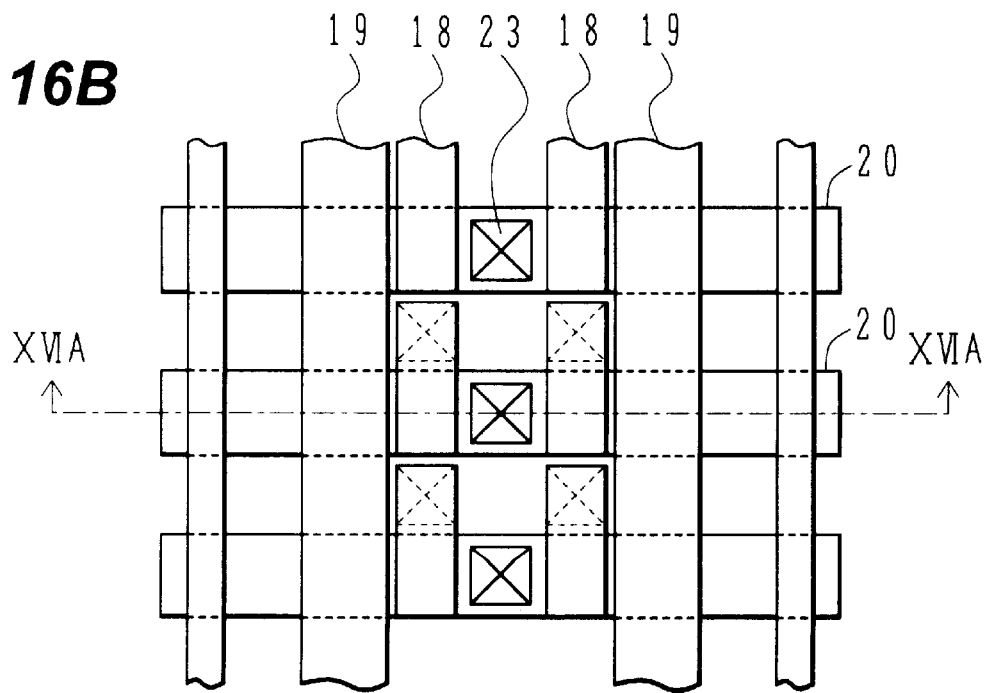

FIGS. 16A and 16B show the structure of memory cells according to another embodiment of the invention. The memory cell of this embodiment has functions similar to the memory cell shown in FIG. 12A. Opposing electrodes 18 and 19 are formed on the upper surface of a ferroelectric layer 20. The surface of the opposing electrodes 18 and 19 is covered with a silicon oxide film 21 which is formed with an opening reaching a source region 5. The electrode 18 is connected to a gate electrode 4 via a conductive plug 25 formed at a position not shown in FIG. 16A, and the electrode 19 is connected to a drain region 6 via a conductive plug 26 formed at a position not shown in FIG. 16A. The other structure is similar to that shown in FIG. 12A.

FIG. 16B is a top view of the memory cell shown in FIG. 16A. A cross section taken along line XVIA—XVIA in FIG. 16B corresponds to the cross section shown in FIG. 16A. An area indicated by cross hatching is an area where a contact hole is formed.

Figure 17A:
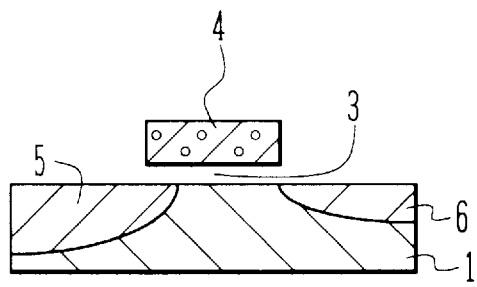
FIGS. 17AV to 17DP and FIGS. 18AV to 18CP are cross sectional views and plan views illustrating manufacture processes for the ferroelectric memory device shown in FIGS. 16A and 16B.
Figure 17A:
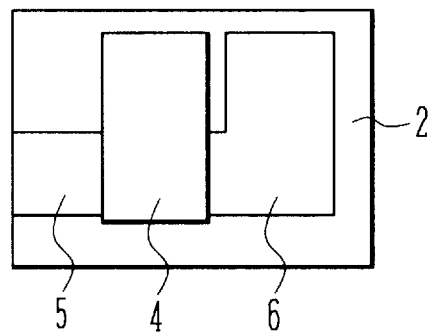
Figure 18A:
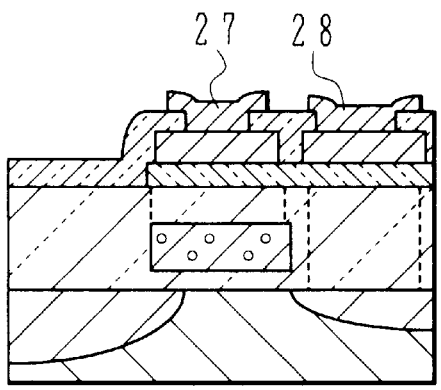
Figure 18A:
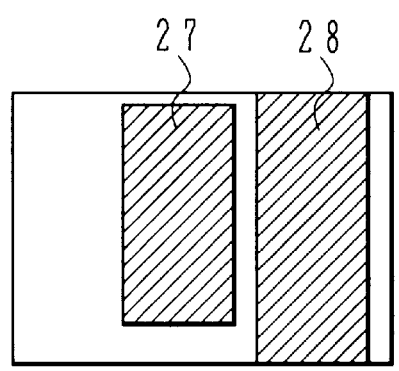

FIGS. 17AV to 17DP and FIGS. 18AV to 18CP are cross sectional views and plan views illustrating manufacture processes for the memory cells shown in FIGS. 16A and 16B. Drawing numbers with V represent a cross sectional view, and drawing numbers with P represent a plan view.

As shown in FIG. 17AP, on the surface of a p-type silicon substrate 1, a field oxide film 2 is formed to define active regions.

As shown in FIG. 17AV, on the surface of the active region, a gate oxide film 3 having a thickness of about 10 nm is formed through thermal oxidization. On the surface of the gate oxide film 3, a polysilicon layer 4 is deposited to a thickness of about 200 nm. This polysilicon layer 4 is patterned to form a gate electrode 4 which extends from the gate oxide film 3 to the field oxide film 2. By using the gate electrode 4 as a mask, ions are implanted to form source/drain regions 5 and 6.

In order to increase the overlap amount between the gate electrode 4 and the source region 5. As ions are implanted into the source region 5 under the conditions of an incidence angle of 60 degrees, an acceleration energy of 30 keV, and a dose of $1\times10^{15}$ cm$^{-2}$, whereas As ions are implanted along the vertical direction into the drain region 6 under the conditions of an acceleration energy of 30 keV and a dose of $1\times10^{15}$ cm$^{-2}$.

Figure 17B:
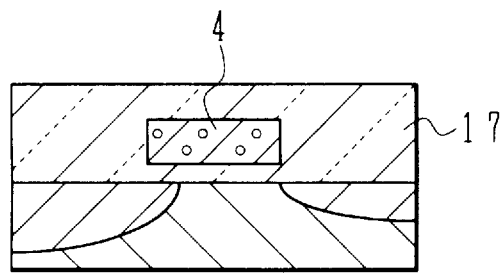
Figure 17B:
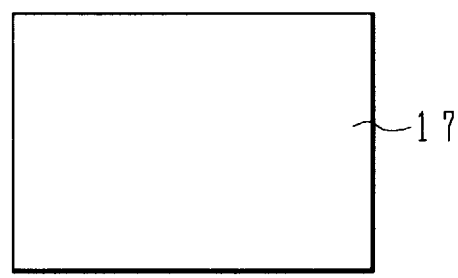

As shown in FIGS. 17BV and 17BP, a silicon oxide film 17 is deposited over the substrate by chemical vapor deposition (CVD), the silicon oxide film 17 covering the gate electrode 4. After the silicon oxide film 17 is formed, the surface of this film 17 is planarized by CMP.

Figure 17C:
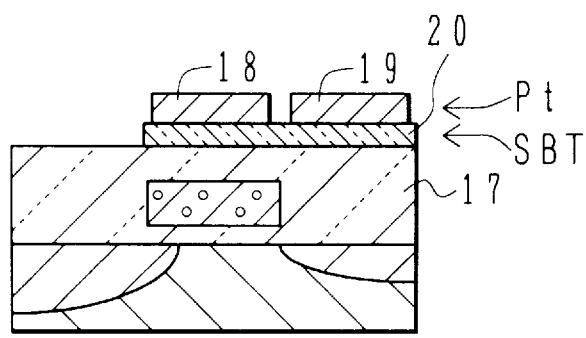
Figure 17C:
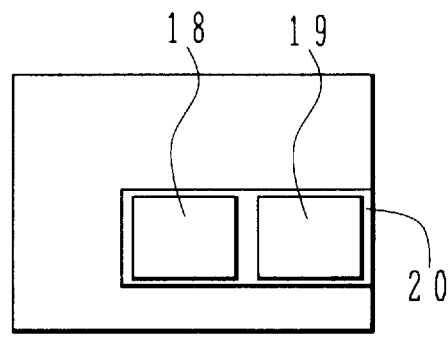

As shown in FIG. 17CV and 17CP, o n the planarized surface of the silicon oxide film 17, an SBT layer 20 having a thickness of, for example, 200 nm, is formed. The SBT layer may be formed by a sol/gel method for example. The deposited SBT layer 20 is etched and patterned with a mixture gas of $CF_4$ and Ar.

Next, a Pt layer is formed through sputtering and etched and patterned with a mixture gas of $CF_4$ and Ar to form opposing electrodes 18 and 19.

Figure 17D:
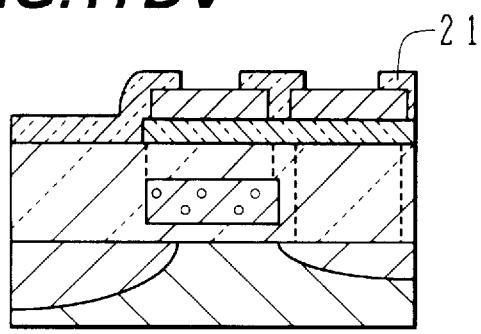
Figure 17D:
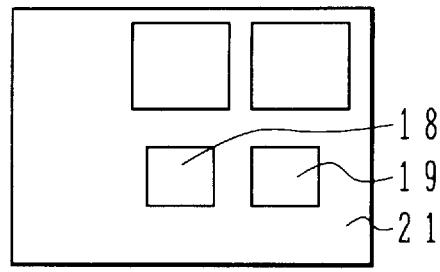

As shown in FIGS. 17DV and 17DP, a silicon oxide film 21 is formed by CVD, covering the SBT layer 20 and the opposing electrodes 18 and 19. A resist pattern is formed on the surface of the silicon oxide film 21, and connection holes to the opposing electrodes 18 and 19 and to the gate electrodes and the drain region are formed through the silicon oxide films 21 and 17.

As shown in FIGS. 18AV and 18AP, a laminated wiring layer made of a Ti layer, a TiN layer, and an Al layer is formed over the surface of the substrate formed with the connection holes, and patterned to form wiring layers 27 and 28. The wiring layer 28 is used as a bit line. The Ti layer improves tight adhesion, and the TiN layer functions as a diffusion barrier layer.

Figure 18B:
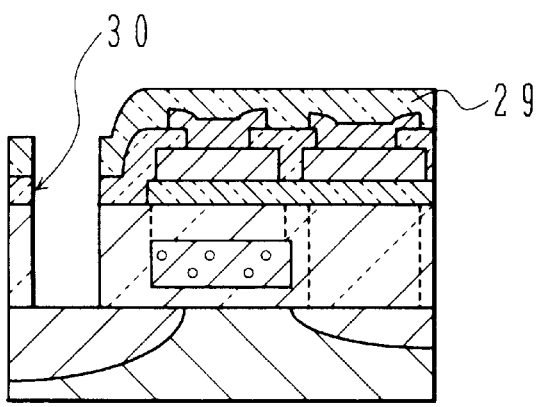
Figure 18B:
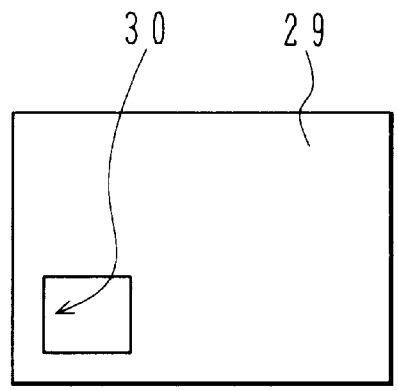

As shown in FIGS. 18BV and 18BP, a silicon oxide film 29 is deposited by CVD, covering the substrate surface, and a contact hole 30 reaching the source region 5 is formed.

Figure 18C:
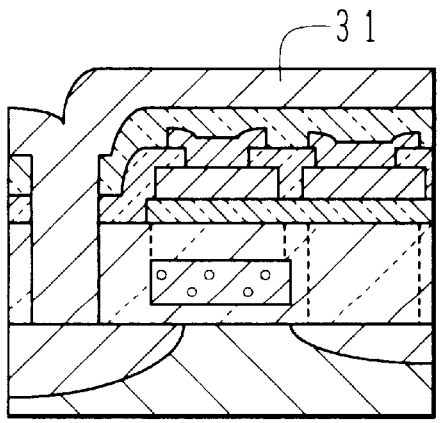
Figure 18C:
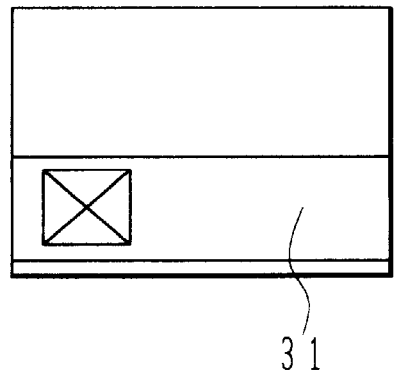

As shown in FIGS. 18CV and 18CP, a laminated wiring layer made of a Ti layer, a TiN layer, and an Al layer is formed patterned to form a word line.

The present invention has been described in connection with the preferred embodiments. The invention is not limited only to the above embodiments. It will be apparent to those skilled in the art that various modifications, improvements, combinations, and the like can be made.

What is claimed is:

1. A ferroelectric memory device comprising:
   a semiconductor substrate;
   an insulated-gate field effect transistor including a gate insulating film formed on a surface of said semiconductor substrate, a gate electrode formed on the gate insulating film, and source and drain regions formed in a surface layer of said semiconductor substrate on both sides of the gate electrode;
   an insulating film formed over the surface of said semiconductor substrate and covering the gate electrode;
   a ferroelectric film formed on said insulating film; and
   a pair of capacitor electrodes formed on one surfacer of said ferroelectric film and facing each other, one of said pair of capacitor electrodes being electrically connected to the gate electrode.

2. A ferroelectric memory device according to claim 1, wherein a gap between said pair of capacitor electrodes has a value threefold or less as large as a thickness of said ferroelectric film.

3. A ferroelectric memory device according to claim 1, wherein one of said pair of capacitor electrodes is disposed above the gate electrode.

4. A ferroelectric memory device according to claim 1, wherein said ferroelectric film is made of SBT or PZT or PLZT.

5. A ferroelectric memory device according to claim 1, wherein said pair of capacitor electrodes are buried in said insulating film, surfaces of said pair of capacitor electrodes and said insulating film form a common surface, and said ferroelectric film covers said pair of capacitor electrodes and said insulating film.

6. A ferroelectric memory device according to claim 1, wherein the other of said pair of capacitor electrodes is electrically connected to one of the source/drain regions.

7. A ferroelectric memory device comprising:
   an insulated-gate field effect transistor having a source, a drain, and an insulated gate; and
   a memory cell including a ferroelectric capacitor connected to the drain and the insulated gate, wherein said capacitor has a pair of electrodes disposed on one surface of a ferroelectric layer of the memory device.

8. A ferroelectric memory device according to claim 7, wherein said insulated-gate field effect transistor has a source/insulated-gate capacitance larger than a drain/insulated-gate capacitance.

9. A ferroelectric memory device according to claim 8, wherein said insulated-gate field effect transistor has an overlap area between the insulated-gate and the source/ larger than an overlap area between the insulated-gate and the drain.

10. A ferroelectric memory device according to claim 7, further comprising a bit line connected to the drain and a word line connected to the source.

11. A ferroelectric memory device according to claim 10, further comprising a control circuit capable of executing a write operation of writing first information in the ferroelectric capacitor by applying a positive potential to the bit line relative to a potential of the word line, and a write operation of writing second information in the ferroelectric capacitor by applying a negative potential to the bit line relative to the potential of the word line.

12. A ferroelectric memory device comprising:
    a plurality of bit lines disposed in parallel;
    a plurality of word lines disposed in parallel, the word lines crossing said bit lines; and
    a ferroelectric memory cell connected at each cross point between said bit and word lines, said ferroelectric memory cell including an insulated-gate field effect transistor having a source, a drain, and an insulated date, and a ferroelectric capacitor connected across the drain and the insulated gate, wherein said capacitor has a pair of electrodes disposed on one surface of a ferroelectric layer of the memory device.

13. A ferroelectric memory device according to claim 12, wherein the insulated-gate field effect transistor has a source-insulated gate capacitance larger than a drain-insulated gate capacitance.

14. A ferroelectric memory device according to claim 13, wherein the insulated-gate field effect transistor has an overlap area between the insulated gate and the source larger than an overlap area between the insulated gate and the drain.

15. A ferroelectric memory device according to claim 12, wherein a coupling ratio $R=C_{gs}/C_{gs}+C_f)$ is 0.2 or larger, where $C_f$ is a capacitance of the ferroelectric capacitor and $C_{gs}$ is a source-insulated gate capacitance.

16. A ferroelectric memory device according to claim 12, further comprising a control circuit capable of executing a write operation of writing first information in the ferroelectric capacitor by applying a positive potential to the bit line relative to a potential of the word line, and a write operation of writing second information in the ferroelectric capacitor by applying a negative potential to the bit line relative to the potential of the word line.

17. A method of driving a ferroelectric memory device which comprises:
    a plurality of bit lines disposed in parallel;
    a plurality of word lines disposed in parallel, the word lines crossing said bit lines; and
    a ferroelectric memory cell connected at cross point between said bit and word lines, said ferroelectric memory cell including an insulated-gate field effect transistor having a source, a drain, and an insulated gate, and a ferroelectric capacitor connected across the drain and the insulated-gate, the method comprising the steps of:
    (a) connecting a selected word line to a ground potential and applying a first reference potential to other word lines and all the bit lines, to write first information in all the ferroelectric memory cells connected to the selected word line;
    (b) supplying in succession the ground potential and the first reference potential to ferroelectric memory cells to be written with first information among the ferroelectric memory cells connected to the selected word line, and supplying a second reference potential smaller than the first reference potential to other bit lines and a third reference potential larger than the second reference potential to other word lines, to write first information in the ferroelectric memory cells to be written with first information; and (c) setting potentials of the bit lines and potentials of the word lines other than the selected word line to same potentials as said step (b), and supplying a fourth reference potential larger than the first reference potential to the selected word line, to write second information in ferroelectric memory cells not written with first information at said step (b) among the ferroelectric memory cells connected to the selected word line.

18. A method of driving a ferroelectric memory device according to claim 17, wherein when the first reference potential is Vcc, the second, third, and fourth reference potentials are about Vcc/3, about 2 Vcc/3, and about 4 Vcc/3, respectively.

19. A ferroelectric memory device comprising:

a semiconductor substrate;

an insulated gate electrode formed on said semiconductor substrate;

a source region and a drain region formed in a surface layer of said semiconductor substrate on both sides of said insulated-gate;

a first insulating layer formed over a surface of said semiconductor substrate, surrounding said insulated gate electrode, and forming a common upper surface;

an aperture groove reaching the drain through said first insulating layer;

a bit wiring burying said aperture groove and forming an upper surface common with said first insulating film; and a ferroelectric layer formed on the common upper surface and covering said insulated gate electrode and said bit wiring.

20. A ferroelectric memory device according to claim 19, further comprising:

a second insulating layer formed over said semiconductor substrate and covering said ferroelectric layer;

an opening reaching the source region through said second and first insulating films; and a word wiring burying said opening, crossing said bit wiring, and extending on said second insulating layer.

* * * * *